(12) United States Patent
Chen

(10) Patent No.: US 7,084,057 B2
(45) Date of Patent: Aug. 1, 2006

(54) BIT LINE CONTACT STRUCTURE AND FABRICATION METHOD THEREOF

(75) Inventor: Meng-Hung Chen, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 5 days.

(21) Appl. No.: 11/019,339

(22) Filed: Dec. 21, 2004

(65) Prior Publication Data

US 2005/0098824 A1    May 12, 2005

Related U.S. Application Data

(62) Division of application No. 10/761,702, filed on Jan. 21, 2004.

(30) Foreign Application Priority Data

Jul. 11, 2003    (TW) .............................. 92118966 A

(51) Int. Cl.
*H03L 21/4763*    (2006.01)

(52) U.S. Cl. ...................... 438/637; 438/627

(58) Field of Classification Search ................ 438/597, 438/618, 638, 637, 639, 627
See application file for complete search history.

(56) References Cited

U.S. PATENT DOCUMENTS 6,066,569 A     5/2000   Tobben
6,475,905 B1 *  11/2002  Subramanian et al. ...... 438/637

OTHER PUBLICATIONS

Hong Xiao, "Introduction to semiconductor manufacturing technology", 2001, pp. 568-569, Prentice Hall Inc., USA.
Stanley Wolf, "Silicon Processing for the VLSI Era: Process Integration, vol. 2", 1990, pp. 214-217, Lattice Press, USA.

* cited by examiner

*Primary Examiner*—Bradley K. Smith
(74) *Attorney, Agent, or Firm*—Quintero Law Office

(57) ABSTRACT

A bit line contact structure and fabrication method thereof. The method includes providing a substrate having a transistor, with a gate electrode, drain region, and source region, on the substrate, blanketly forming a first dielectric layer on the transistor using spin coating, and patterning the first dielectric layer, forming a via exposing the drain region.

18 Claims, 29 Drawing Sheets

BIT LINE CONTACT STRUCTURE AND FABRICATION METHOD THEREOF

This application is a divisional of U.S. application Ser. No. 10/761,702, filed Jan. 21, 2004.

BACKGROUND OF THE INVENTION

1. Field of the Invention

The present invention relates to a bit line contact structure and fabrication method thereof, and more specifically to a bit line contact structure using a spin-coating material as a pre-metal dielectric layer.

2. Description of the Related Art

As the integrity of integrated circuits increases, the size of semiconductor device is reduced. A dynamic random access memory (DRAM) device, for example, has a design rule for 64 MB DRAM of 0.3 μm or less, with design rule of 128 MB and 256 MB as low as 0.2 μm or less.

In a bit line contact structure, for example, when the line width is reduced to approximately 0.11 μm, the width of a drain region exposed by a bit line contact via is also reduced. When forming a conductive layer as bit line contact (CB) in the bit line contact via, either CB opening or word line-bit line shorts occur frequently, resulting in device failure, negatively affecting the yield and cost of the process.

Further, a conventional bit line contact structure uses boro-phosphosilicate glass (BPSG) as a pre-metal dielectric (PMD) layer even when the line width is reduced to approximately 0.11 μm, because BPSG has good hole-filling capability. However, when the line width is further reduced to about 0.070 μm to 0.090 μm, the width of the drain region exposed by the bit line contact via is also reduced to approximately 0.040 μm or less. The hole-filling capability of BPSG is insufficient to prevent voids in BPSG used as the PMD layer, further negatively affecting the yield and cost of the process.

Top views of FIGS. 1A through 1E and cross-sections of FIGS. 2A through 2E, 3A through 3E illustrate these problems in a conventional bit line contact structure and fabrication method thereof. Note that FIGS. 2A through 2E are cross-sections along line BB in FIGS. 1A through 1E, and FIGS. 3A through 3E are cross-sections along line CC in FIGS. 1A through 1E.

In FIGS. 1A, 2A, and 3A, first, a substrate 100, such as single crystalline silicon, having a transistor structure, is provided. The substrate 100 has a gate electrode 120 protruding from an active surface of substrate 100. A drain region 132 and source region 134 are disposed on the active surface respectively on two sides of the gate electrode 120. Gate electrode 120 is a word line, having a multi-level structure as required. Gate electrode 120 further has a spacer 126 on the sidewall, resulting in width of exposed drain region 132 between two neighboring gate electrodes 120 reaching approximately 0.040 μm when the design rule is reduced to about 0.070 μm to 0.090 μm.

In FIG. 1B, a dielectric layer 140, shown transparently for subsequent descriptions, is formed on substrate 100.

In FIG. 1C, dielectric layer 140 is patterned. Thus, a via 142 is formed exposing drain region 132.

In FIG. 1D, via 142 is filled with a conductive layer, respectively forming bit line contact pads 162a through 162c, electrically connecting to every drain region 132.

In FIG. 1E, finally, bit lines 190a through 190c, perpendicular to the word line of gate electrode 120, are formed using a metal layer. Bit lines 190a through 190c respectively electrically connect to bit line contact pads 162a through 162c.

In FIG. 2B, a void 145 extending across at least two drain regions 132 appears in dielectric layer 140 during formation thereof using BPSG when the design rule is reduced to about 0.070 μm to 0.090 μm.

In FIG. 2C, when dielectric layer 140 is patterned, the former void 145 becomes void 145' connecting two neighboring vias 142.

In FIG. 2D, the conductive layer fills both via 142 and void 145' during formation of bit line contact pads 162a through 162c, resulting in bridging of the bit line contact pads 162a and 162c, must be isolated each other by isolation 110 and dielectric layer 140 in original design.

Thus, in FIG. 2E, when bit lines 190a through 190c are formed, bit line 190a electrically connects to bit line 190b. Thus, bit line-bit line shorts occur, negatively affecting the yield and cost of the process.

As mentioned above, width of the conventional exposed drain region 132 is approximately 0.040 μm or less, resulting in via 142 being extremely deep relative to the thickness of dielectric layer 140, about 0.3 μm to about 1.0 μm. The etching reaction during formation of via 142 slows as dielectric layer 140 at the bottom of via 142 is etched, resulting in the remaining dielectric layer 140 not being etched completely, at the bottom of via 142, thereby failing to expose drain region 132.

In order to completely remove the dielectric 140 from the bottom of via 142, over-etching is performed on dielectric 140, exposing drain region 132 as shown in FIG. 3C. Spacer 126 protects gate electrode 120 from electrically connecting to the subsequently formed bit line contact or bit line. Further, dielectric layer 140 is etched with high etch selectivity, of, for example, about 10 to 15, with respect to spacer 126 in order to prevent exposing the conductive layer of gate electrode 120 during etching of dielectric 140, when dielectric layer 140 is BPSG and spacer 126 is silicon nitride. When over-etching is performed to force etching of the dielectric 140 at the bottom of via 142, a part of spacer 126 may be removed, thereby exposing the conductive layer of gate electrode 120.

In FIG. 3D, bit line contact pad 162 electrically connects to the exposed conductive layer of gate electrode 120.

In FIG. 3E, bit line 190a electrically connects to the exposed conductive layer of gate electrode 120 through bit line contact pad 162. Thus, word line-bit line short occurs, negatively affecting the yield and cost of the process.

SUMMARY OF THE INVENTION

Thus, objects of the present invention are to provide a bit line contact structure and fabrication method thereof, avoiding bit line-bit line short, CB opening, and word line-bit line short in the process in order to improve process yield and decrease costs.

In order to achieve the described objects, the present invention provides a bit line contact structure comprising a substrate and dielectric layer. The substrate has a transistor thereon, further comprising a gate electrode, drain region, and source region. The dielectric layer, of spin-coating material, is formed blanketly on the transistor. The dielectric layer further has an opening exposing the drain region.

The present invention further provides a method of fabricating a bit line contact structure. First, a substrate is provided, having a transistor comprising a gate electrode, drain region, and source region. Then, a dielectric layer is formed blanketly on the transistor using spin coating. Finally, the dielectric layer is patterned, forming a via exposing the drain region.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiment is intended to illustrate the invention more fully without limiting the scope of the claims, since numerous modifications and variations will be apparent to those skilled in this art.

FIGS. 4A through 4H are top views illustrating a bit line contact structure and fabrication method thereof of the present invention. FIGS. 5A through 5H are cross-sections along line BB in FIGS. 4A through 4H, respectively. FIGS. 6A through 6H are cross-sections along line CC in FIGS. 4A through 4H, respectively.

Figure 1A:
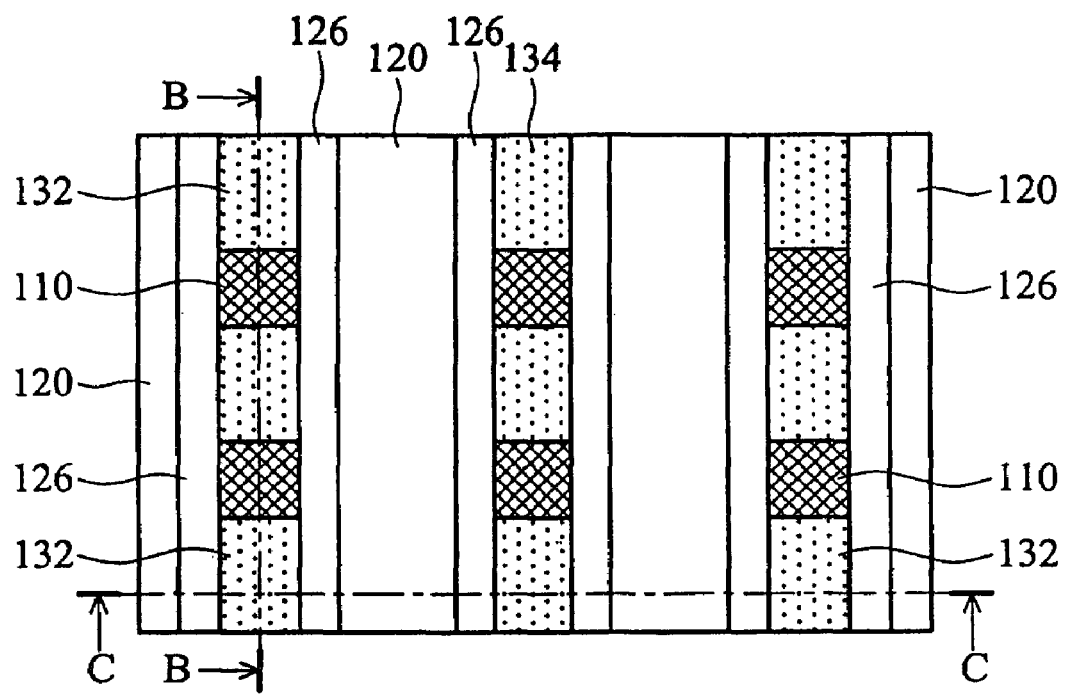
FIGS. 1A through 1E are top views illustrating bit line-bit line short, CB opening, and word line-bit line short occurring in a conventional bit line contact structure and fabrication method thereof.
Figure 1B:
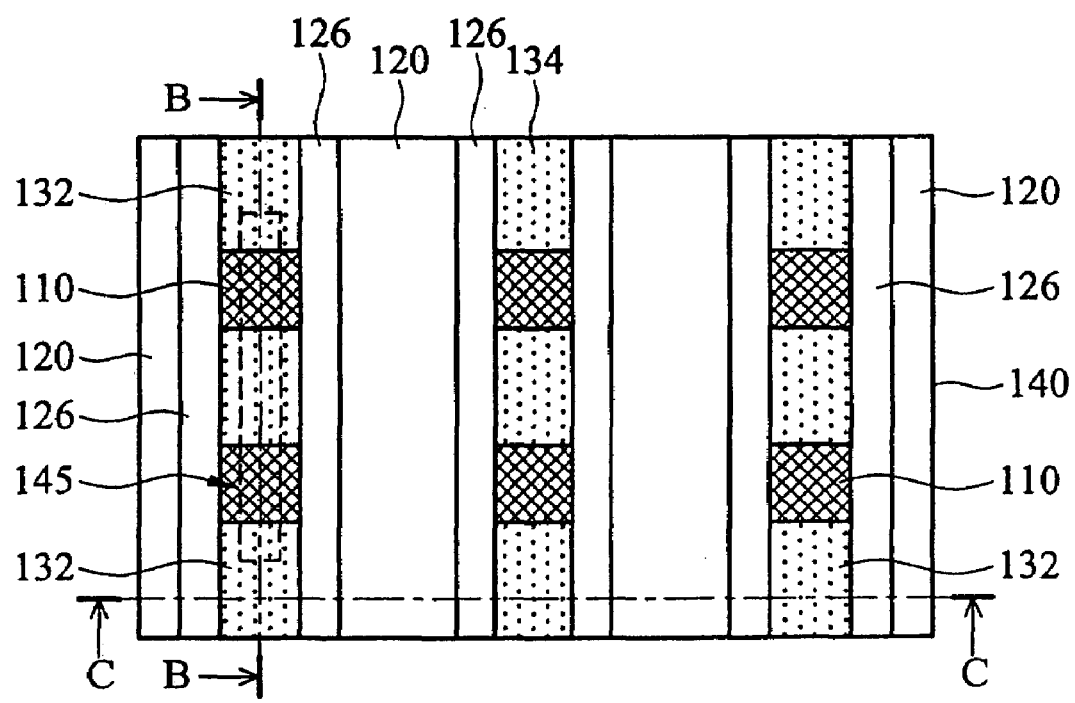
Figure 1C:
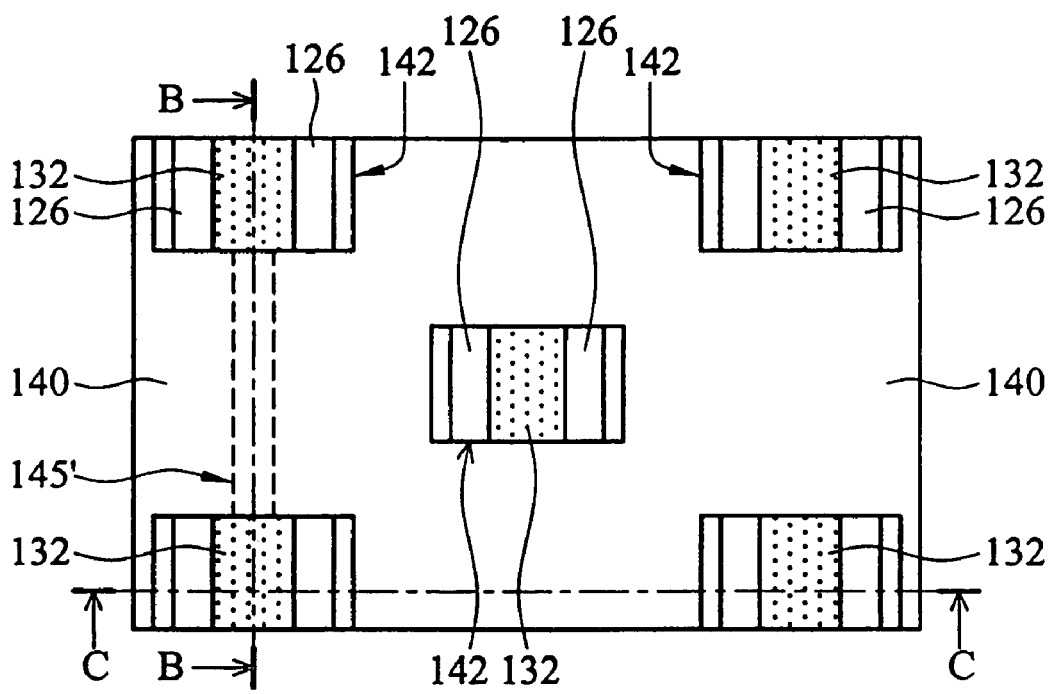
Figure 1D:
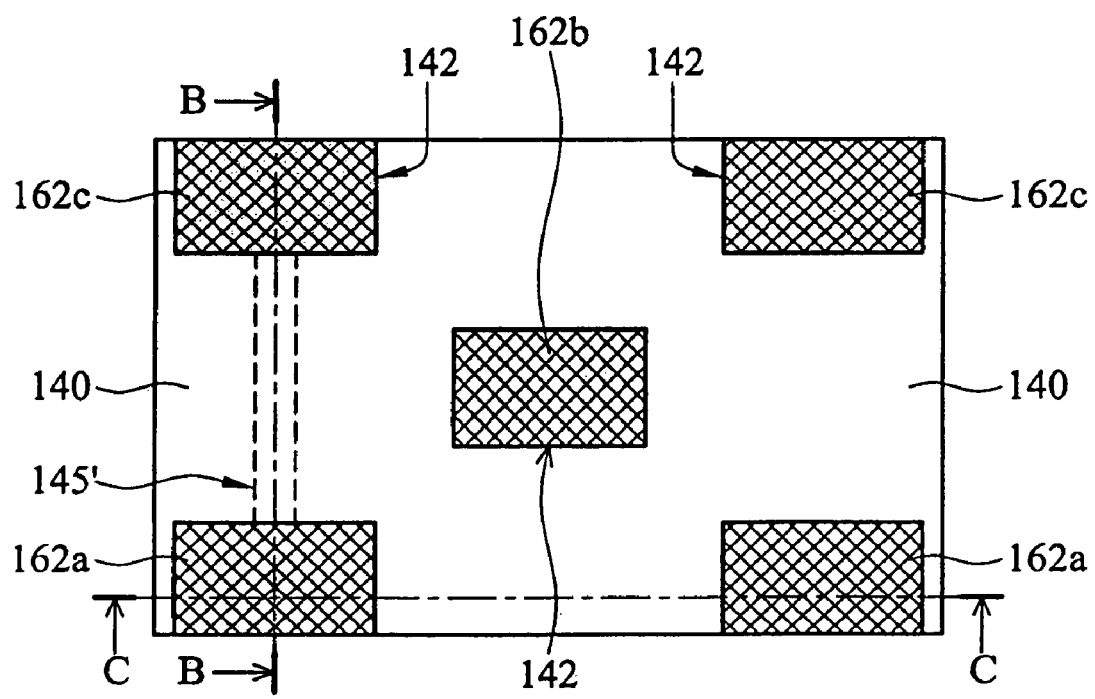
Figure 1E:
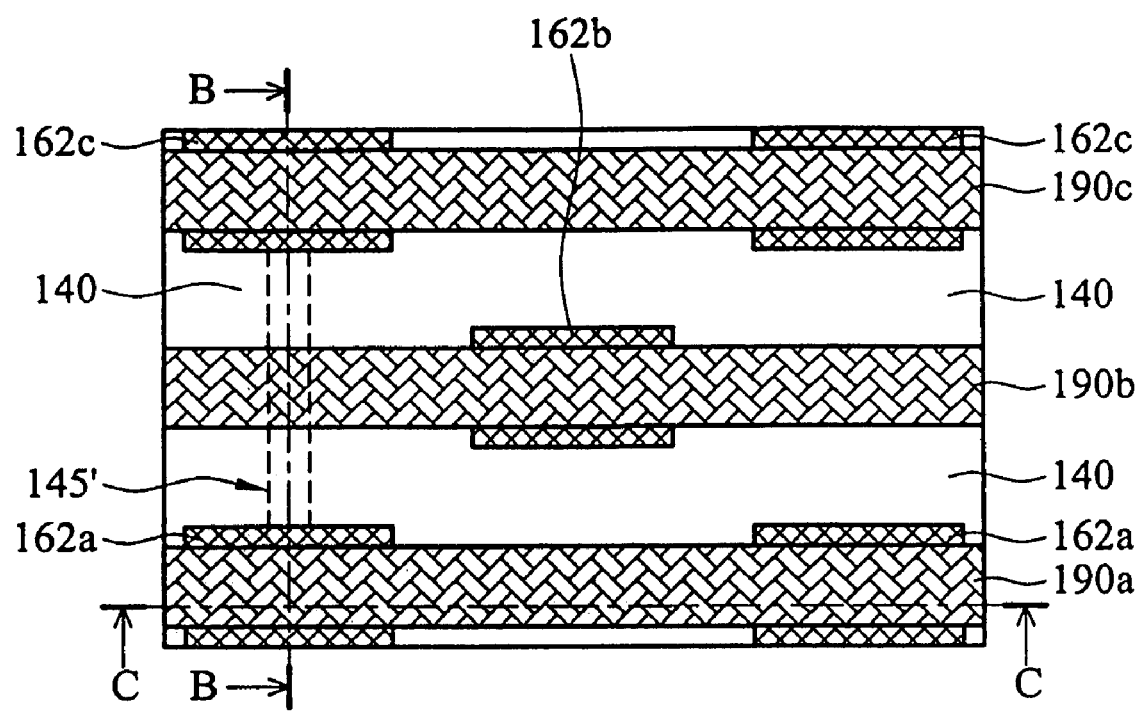
Figure 2A:
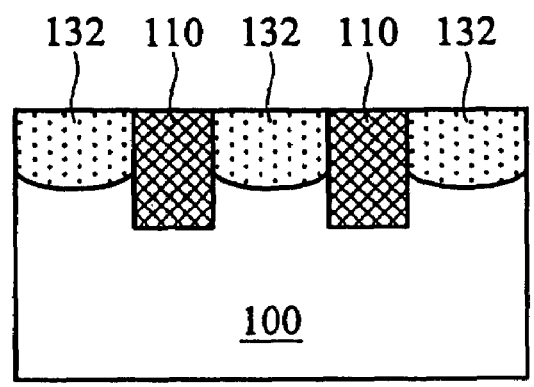
FIGS. 2A through 2E are cross-sections along line BB in FIGS. 1A through 1E, respectively.
Figure 2B:
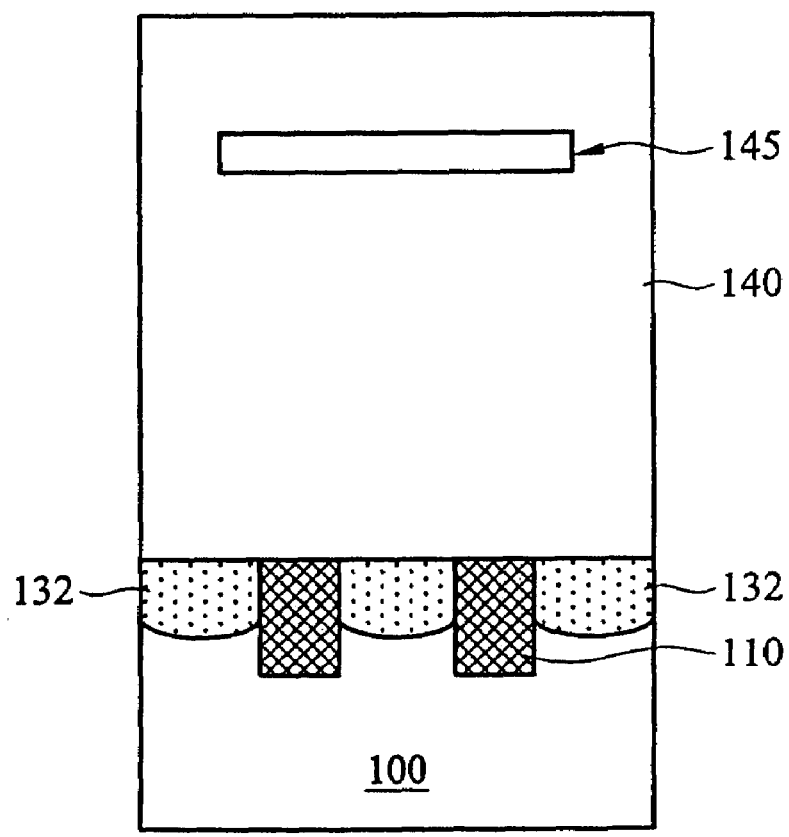
Figure 2C:
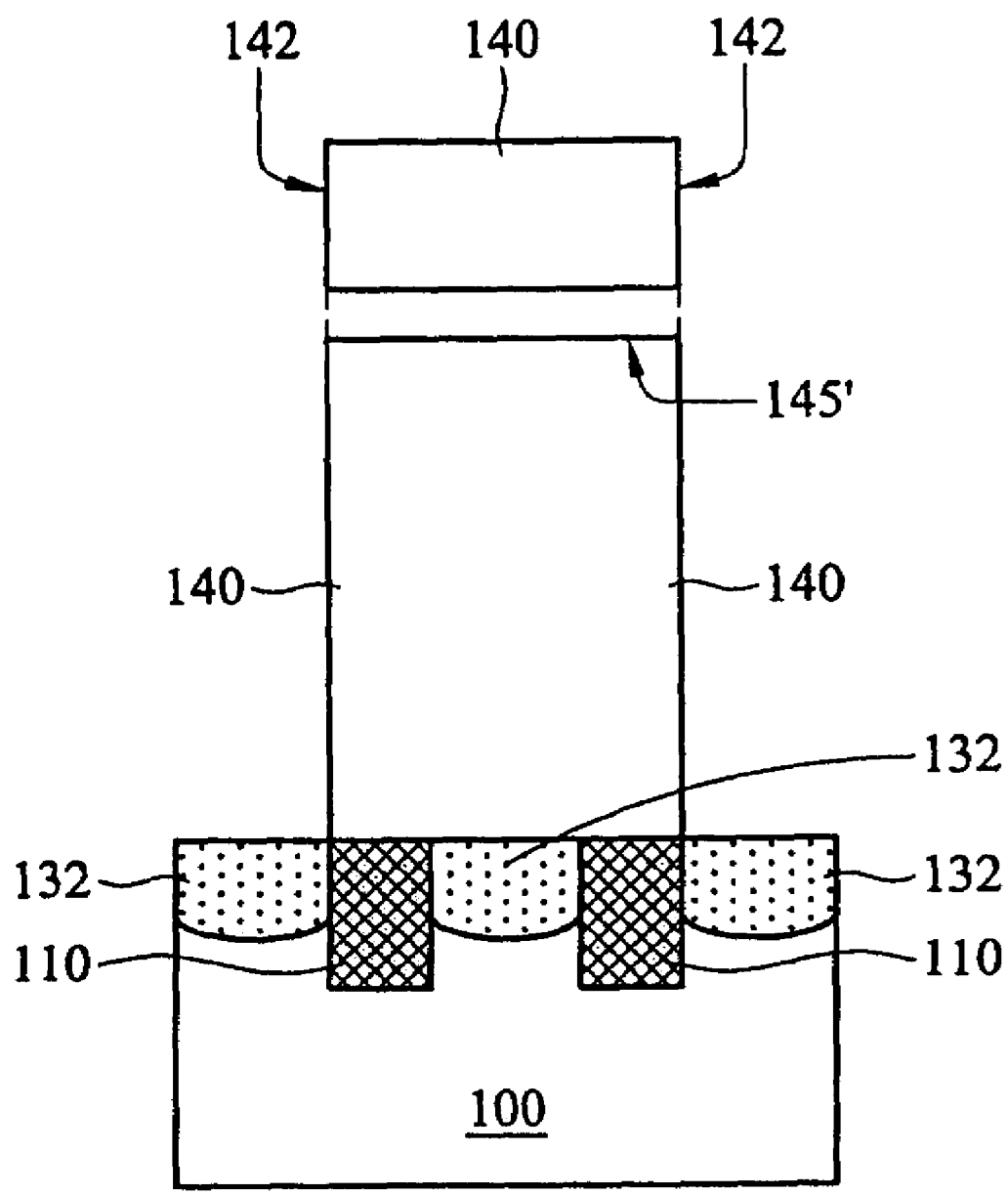
Figure 2D:
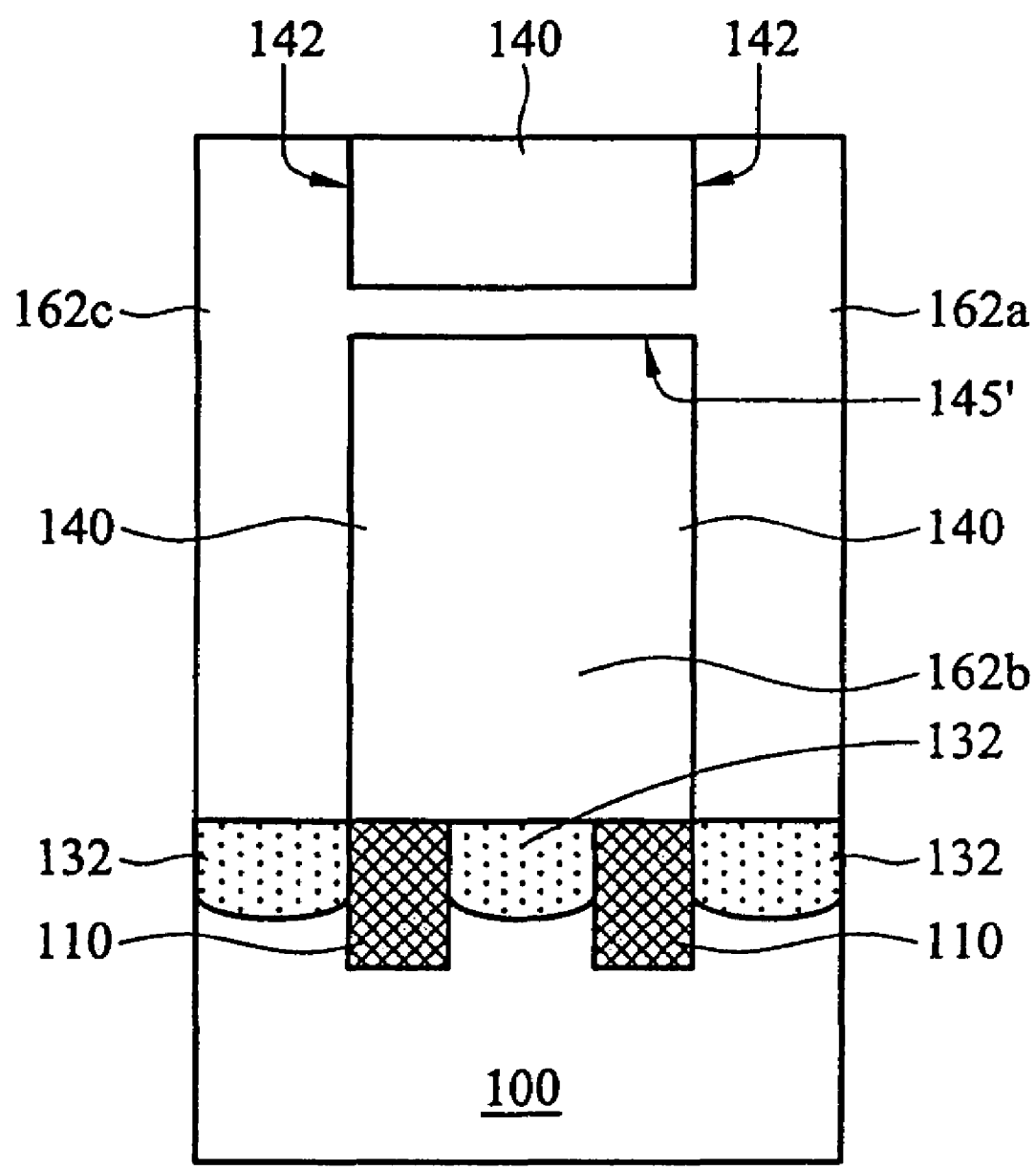
Figure 2E:
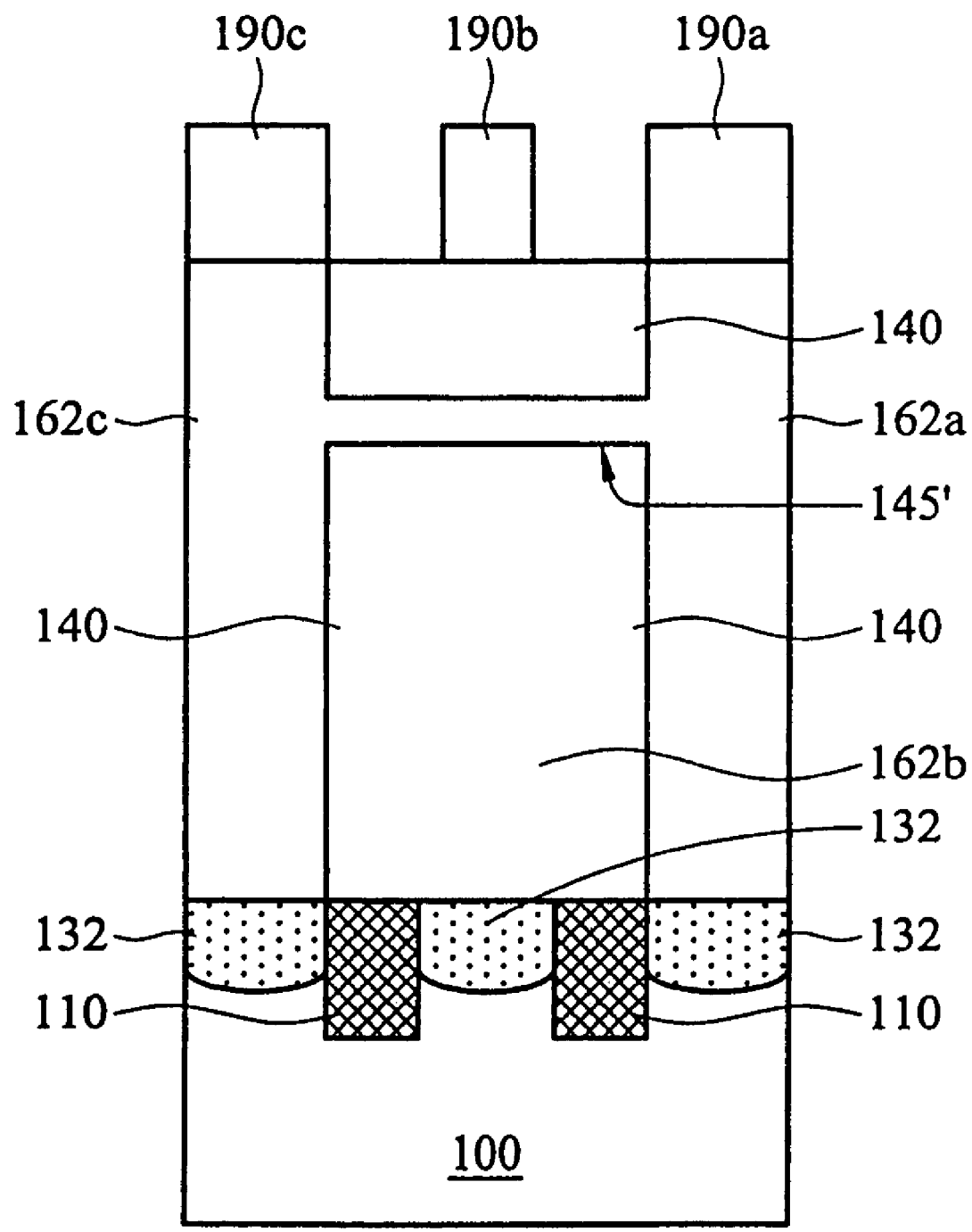
Figure 3A:
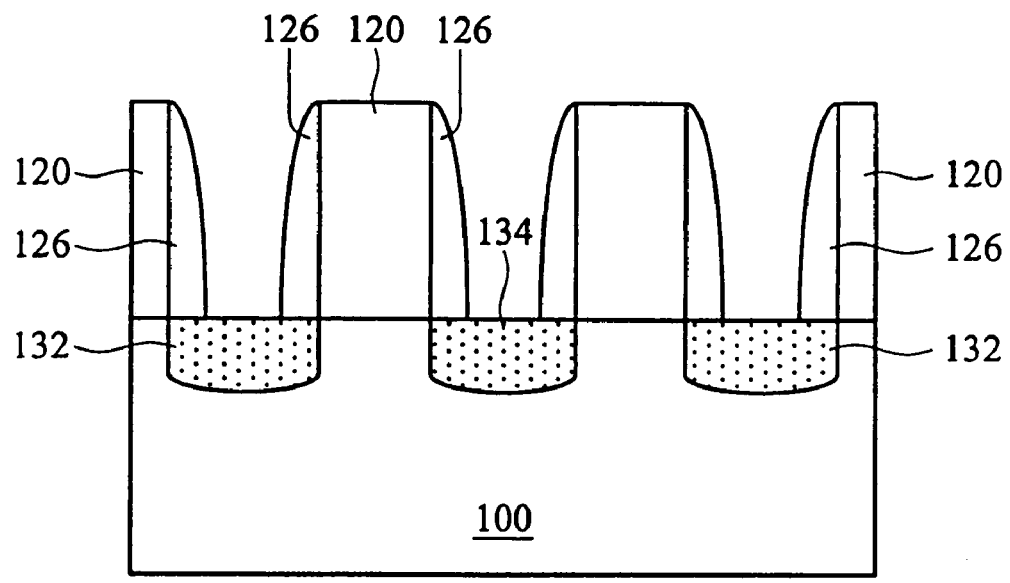
FIGS. 3A through 3E are cross-sections along line CC in FIGS. 1A through 1E, respectively.
Figure 3B:
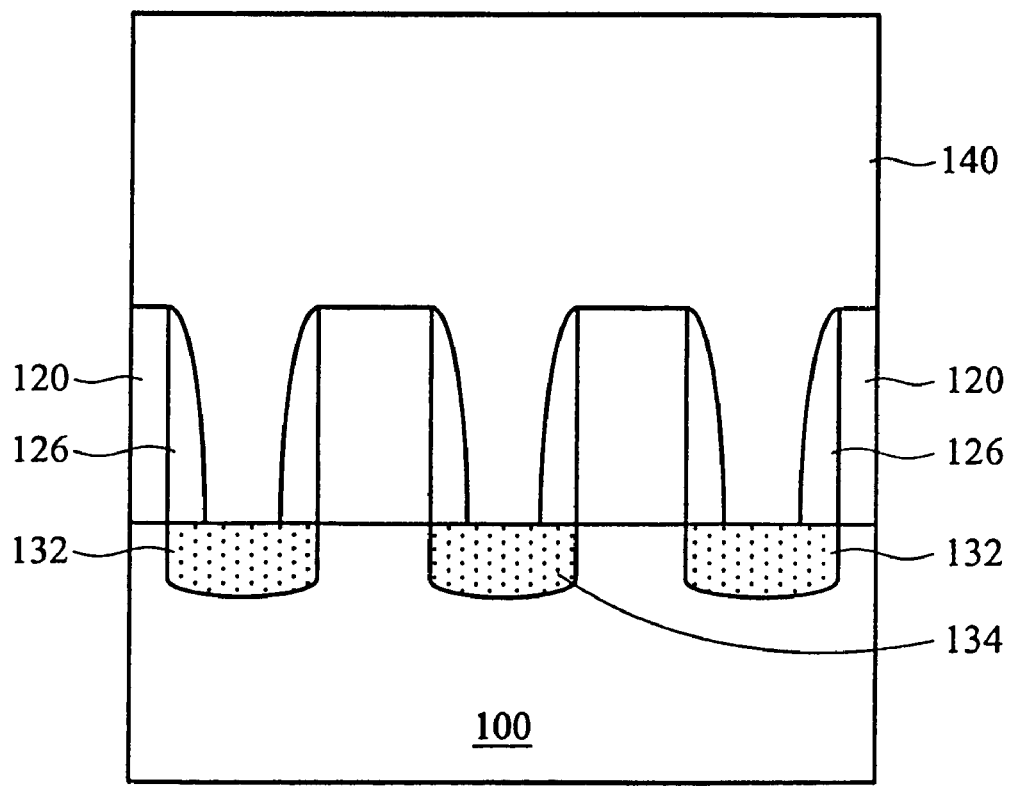
Figure 3C:
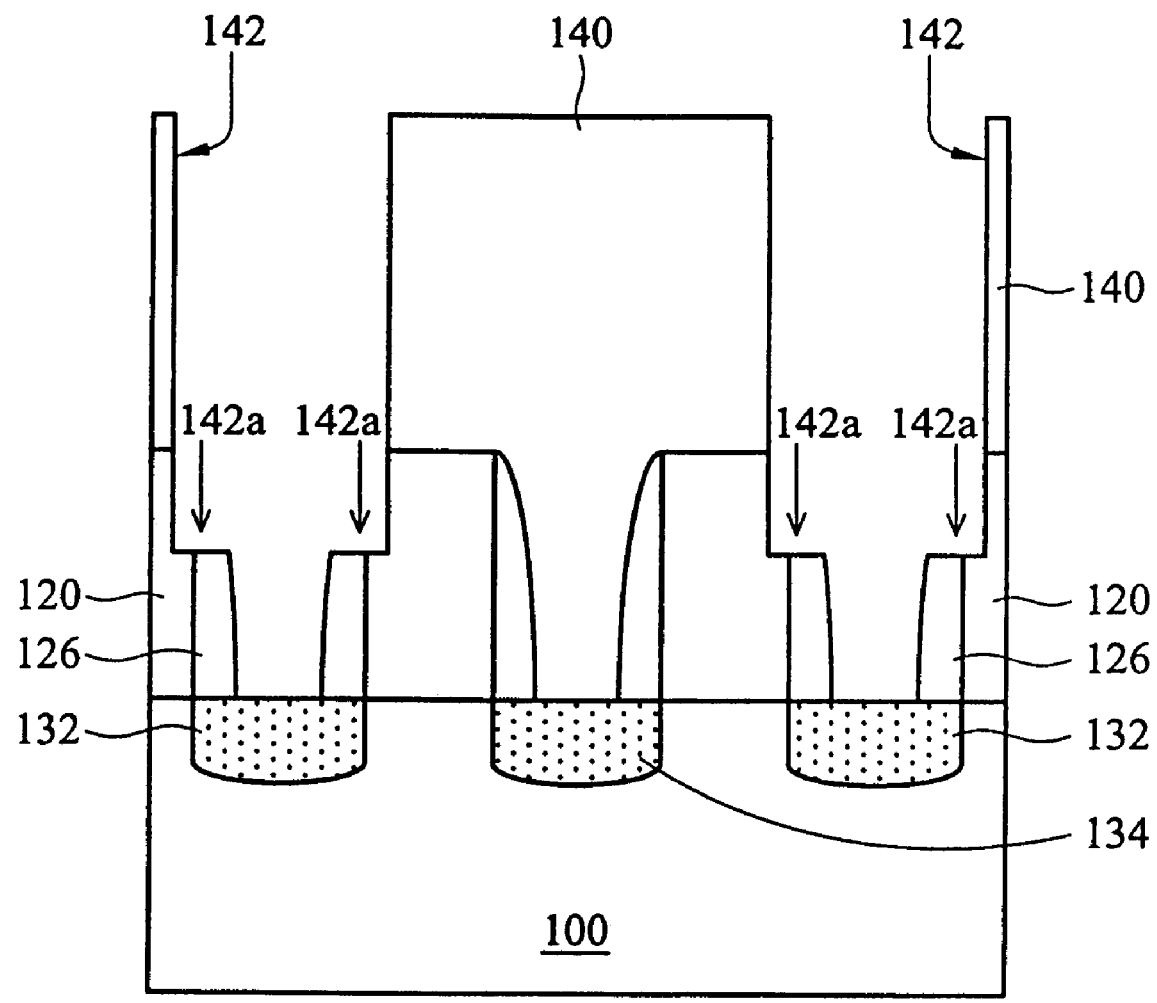
Figure 3D:
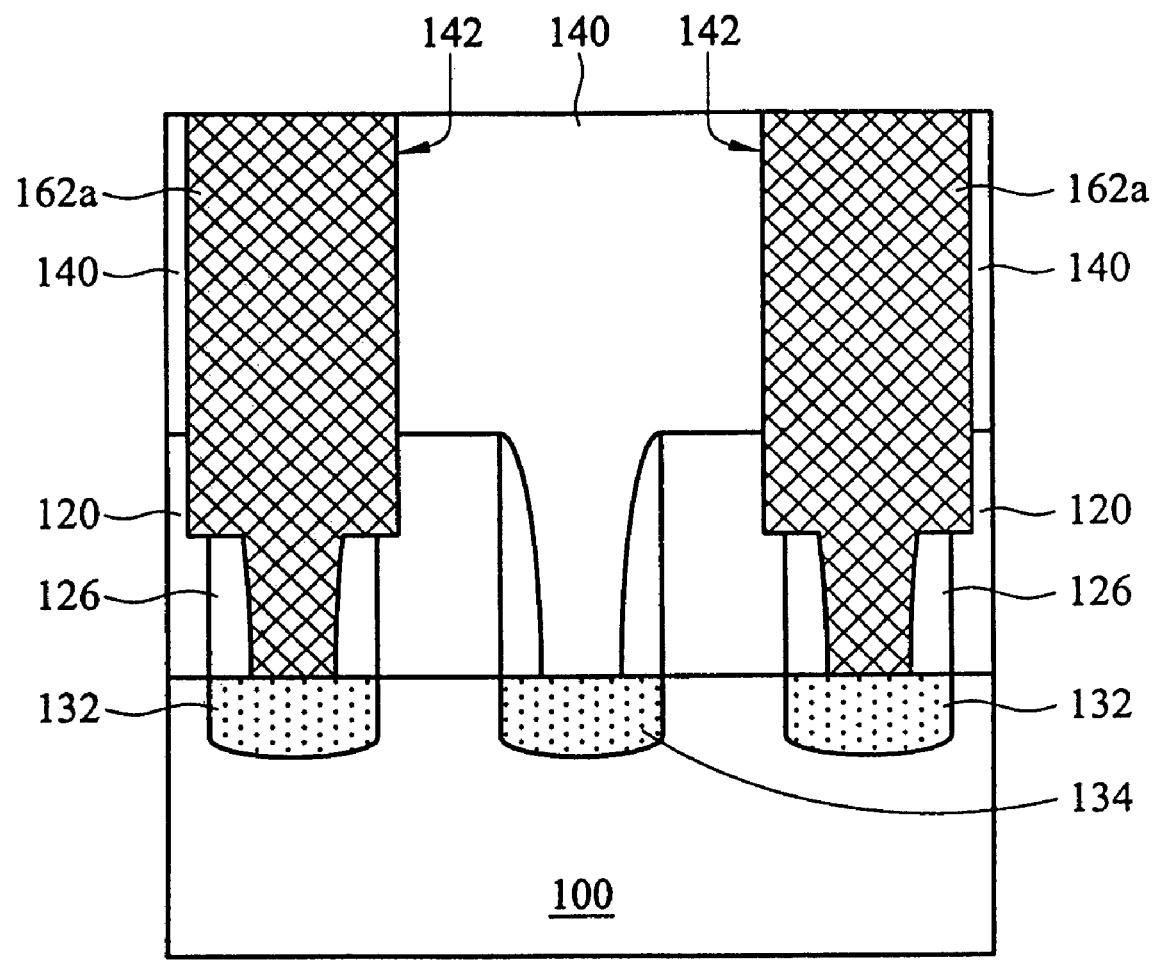
Figure 3E:
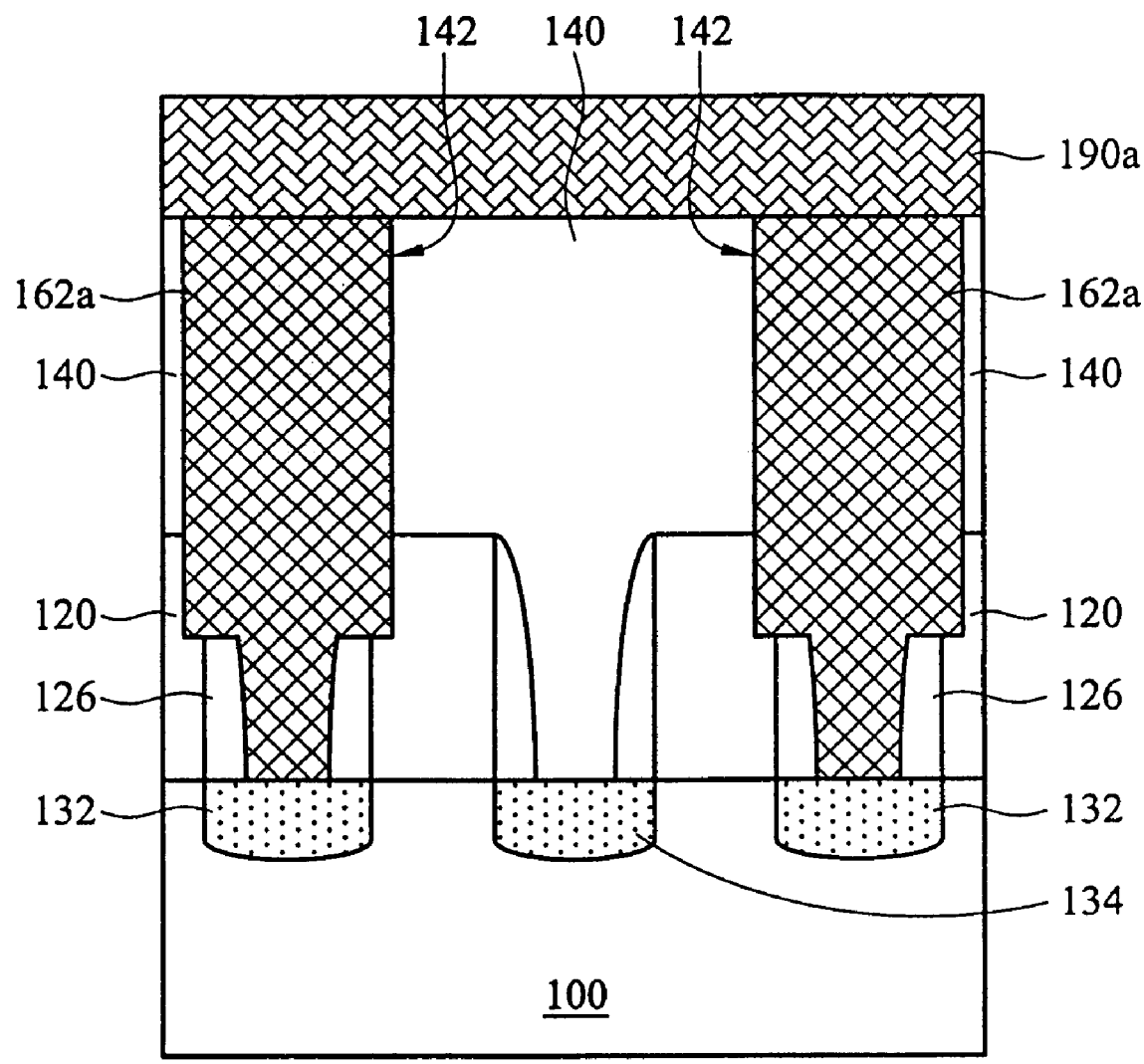
Figure 4A:
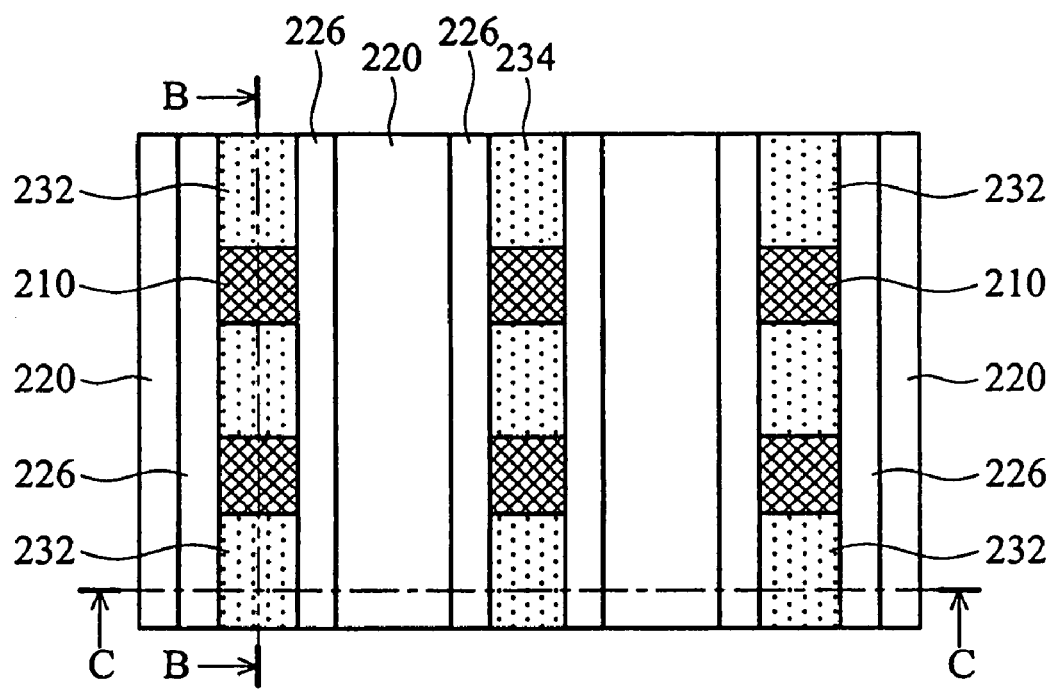
FIGS. 4A through 4H are top views illustrating a bit line contact structure and fabrication method thereof of the present invention.
Figure 5A:
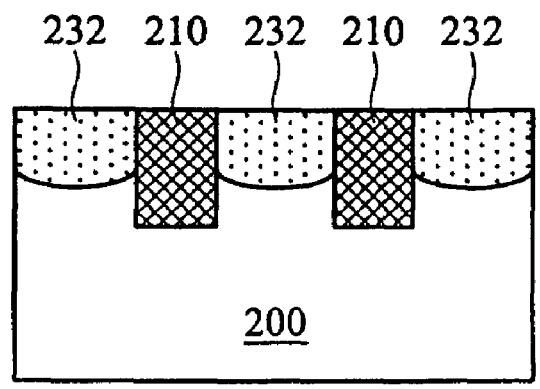
FIGS. 5A through 5H are cross-sections along line BB in FIGS. 4A through 4H, respectively.
Figure 6A:
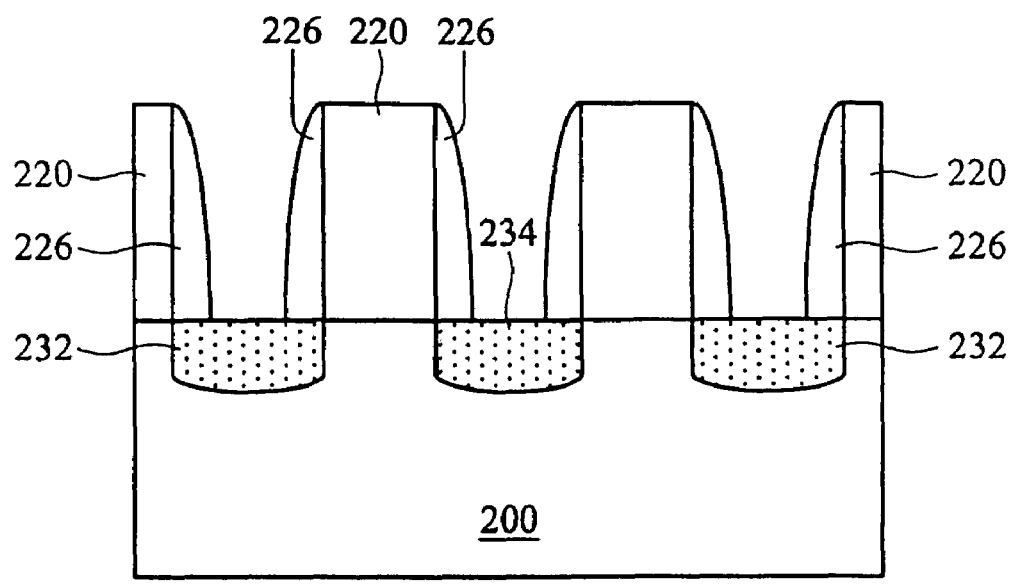
FIGS. 6A through 6H are cross-sections along line CC in FIGS. 4A through 4H, respectively.

In FIGS. 4A, 5A, and 6A, first, a substrate 200, such as single crystalline silicon, having a transistor structure is provided. The substrate 200 has a gate electrode 220 protruding from an active surface of substrate 200 and extending along a Y-axis in FIG. 4A. A drain region 232 and source region 234 are disposed on the active surface respectively on two sides of the gate electrode 220. Two neighboring drain regions 232 and two neighboring source regions 234 along a Y-axis in FIG. 4A are respectively isolated by an isolation 210, such as field oxide (FOX) or shallow trench isolation (STI). Gate electrode 220 is a word line, having a multi-level structure including at least one conductive layer as required. Gate electrode 220 further has a spacer 226 such as silicon nitride on the sidewall, resulting in width of exposed drain region 232 between two neighboring gate electrodes 220 reaching approximately 0.040 μm or less when the design rule is reduced to about 0.070 μm to 0.090 μm.

Figure 4B:
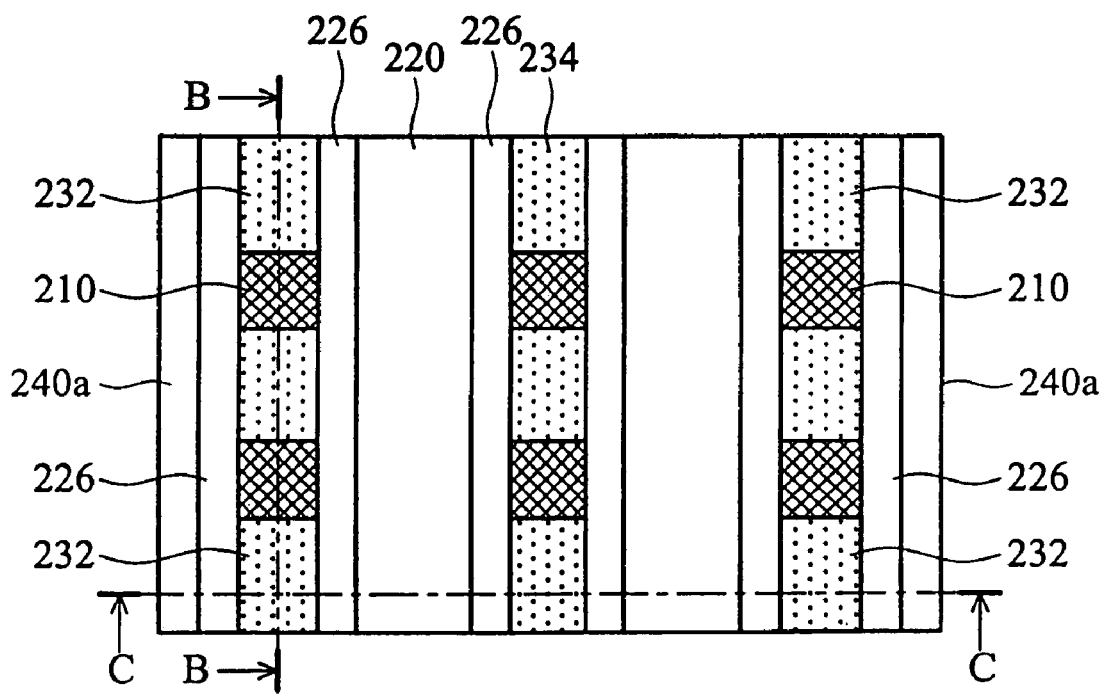
Figure 5B:
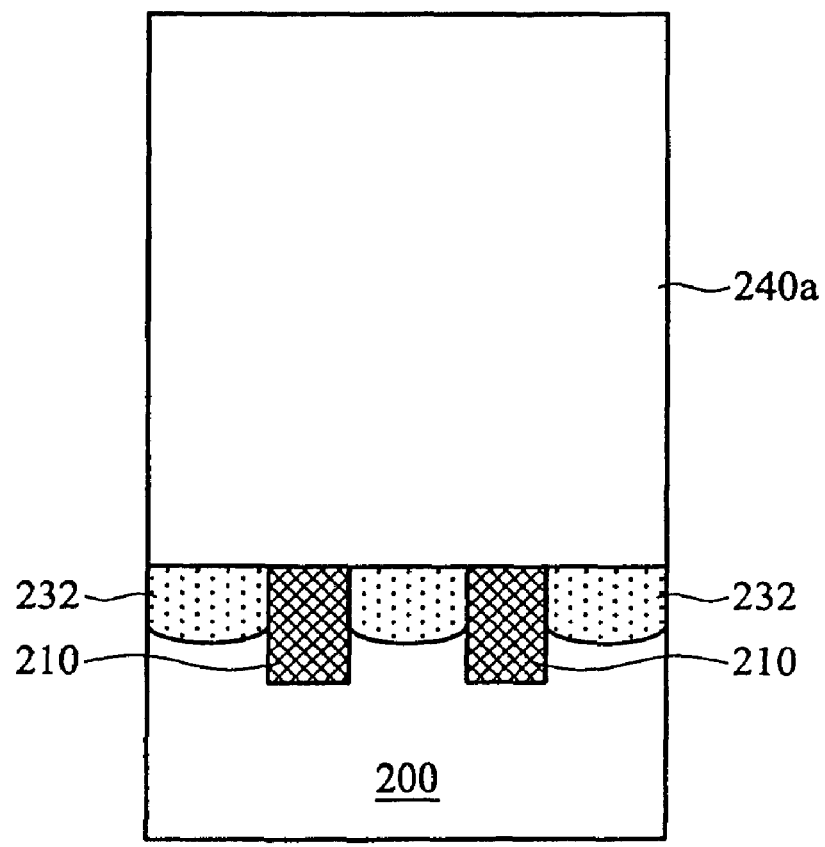
Figure 6B:
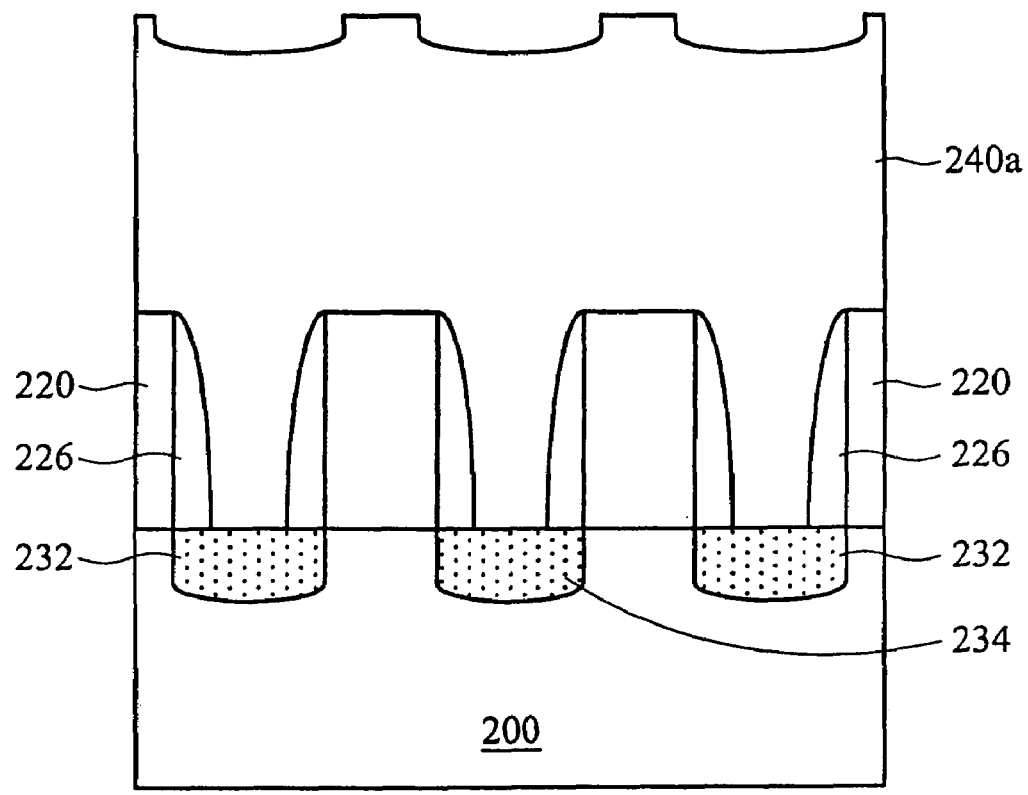

In FIGS. 4B, 5B, and 6B, a dielectric layer 240a, preferably about 3,000 Å to 4,000 Å thick, is formed blanketly on substrate 200 using spin coating, covering gate electrode 220, drain region 232, and source region 234. Dielectric layer 240a is shown transparently in FIG. 4B for subsequent descriptions. Dielectric layer 240a is preferably spin-coating material such as polyimide, low k material, polysilsequioxane, fluorinated polyimide, or other materials, having excellent hole-filling capability and higher etch selectivity, for example, reaching 30 or greater, with respect to spacer 226. Thus, when the design rule is reduced to about 0.070 μm to 0.090 μm, dielectric layer 240a is free of voids possibly generating bit line-bit line short in subsequent steps. Further, dielectric layer 240a above drain region 232 can be completely removed without exposing the conductive layer of gate electrode 220 protected by spacer 226 during formation of via 242.

Figure 4C:
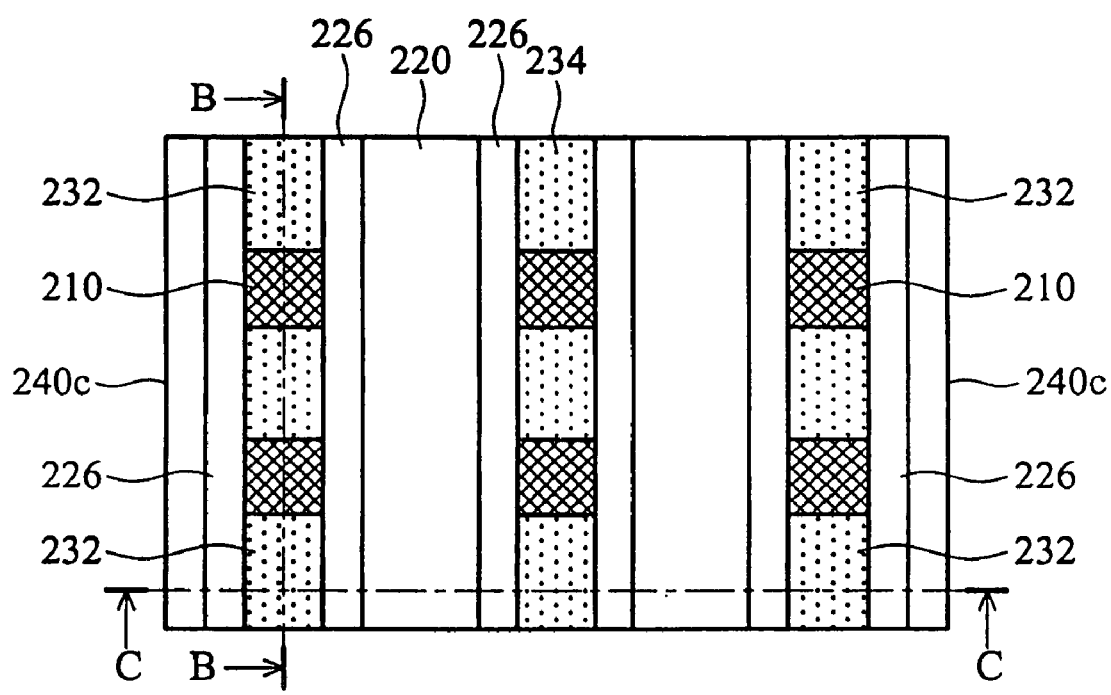
Figure 5C:
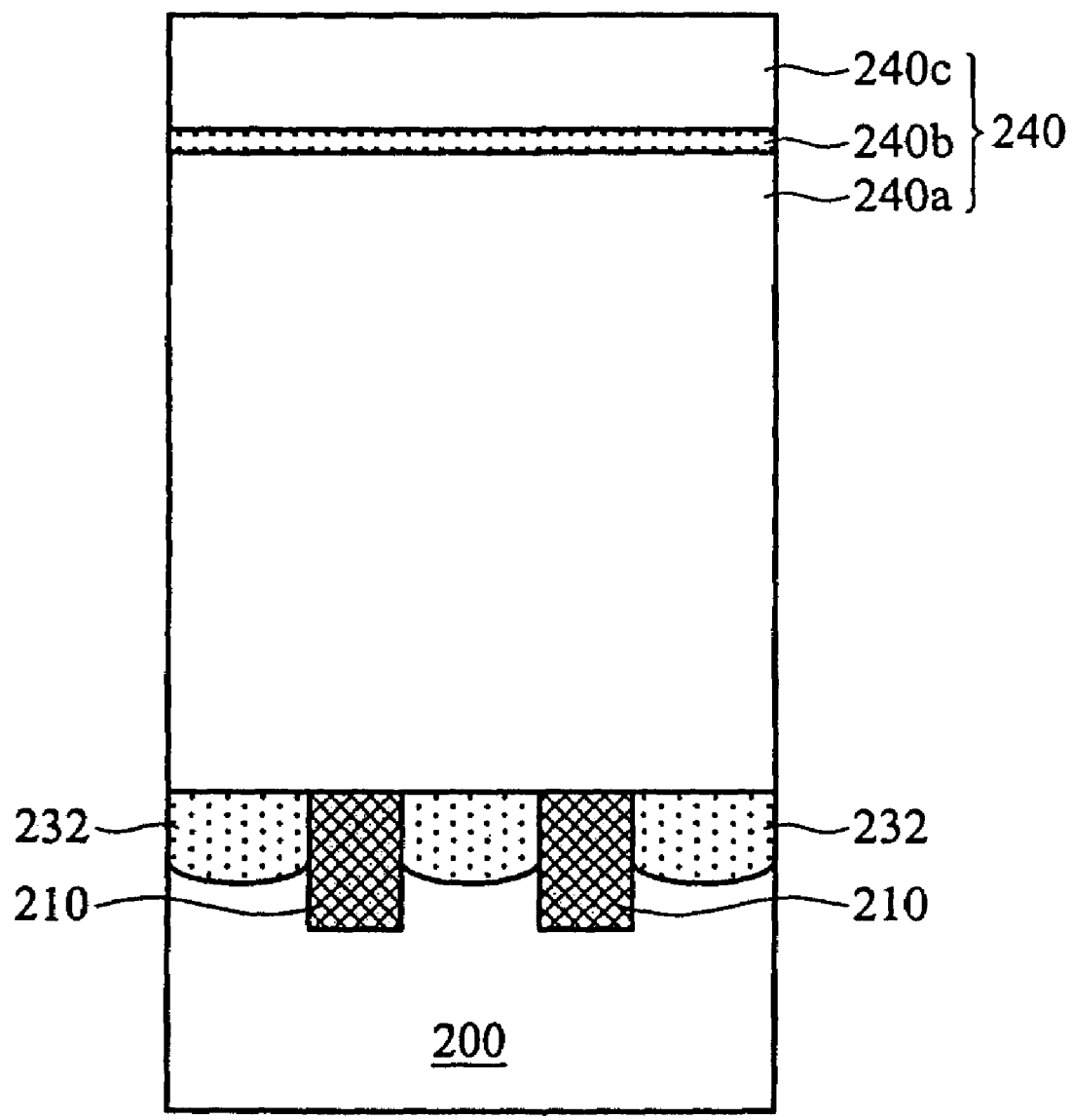
Figure 6C:
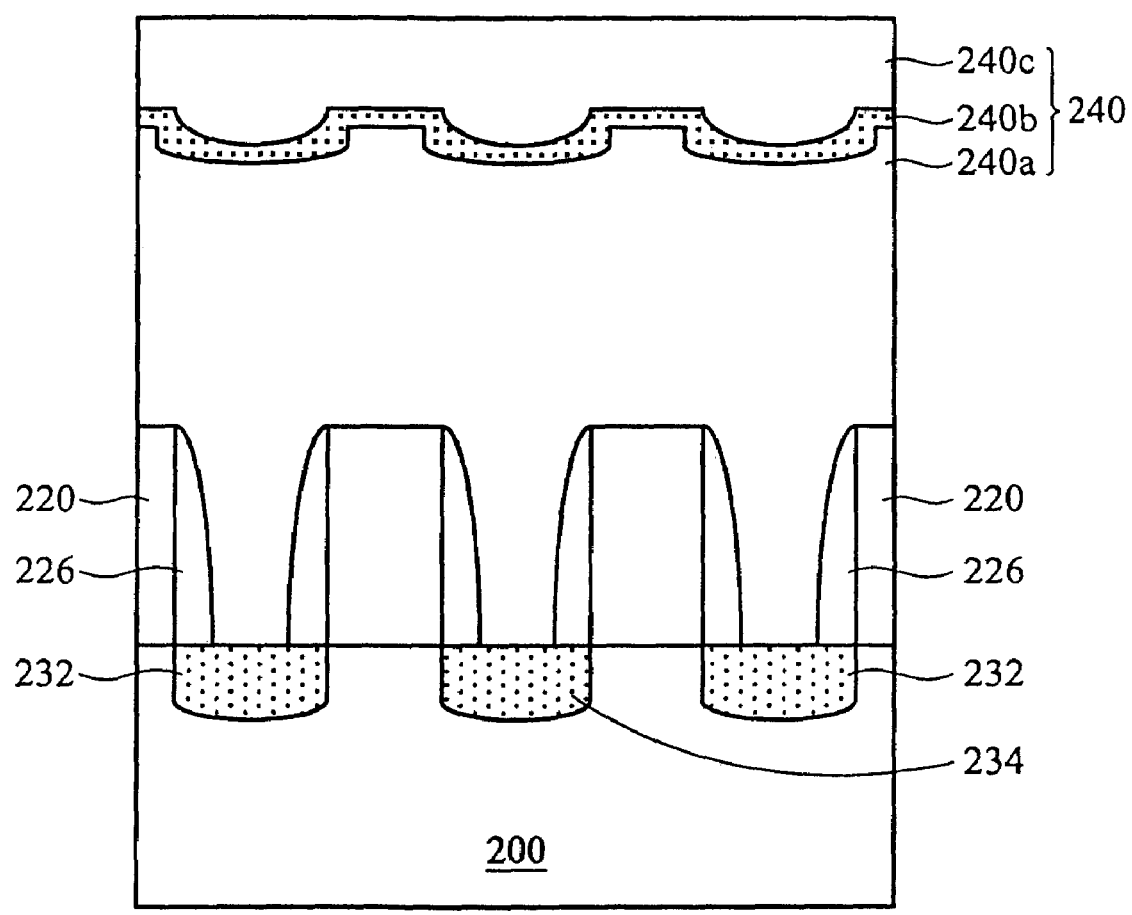

In FIGS. 4C, 5C, and 6C, a conformal barrier layer 240b and blanket dielectric layer 240c are sequentially formed overlying dielectric layer 240a as required. Barrier layer 240b is preferably able to isolate dielectric layer 240a from ozone, oxygen molecules, oxygen atoms and oxygen radicals, such as SiN or other materials. Barrier layer 240b is preferably about 100 Å to 300 Å thick. Both dielectric layer 240a and barrier layer 240b preferably have high etch selectivity with respect to dielectric 240c. Thus, dielectric layer 240c can be, for example, an oxide made by CVD, using a precursor having at least tetra ethoxysilane (TEOS). The initially formed dielectric layer 240c is preferably about 3,000 Å to 6,000 Å thick, and then planarized, removing a thickness about 2,000 Å to 3,000 Å, thereby leaving the dielectric layer 240c about 1,000 Å to 3,000 Å thick as shown in FIGS. 5C and 6C. Thus, a pre-metal dielectric (PMD) layer 240 having dielectric layer 240a as main composition, barrier layer 240b, and dielectric layer 240c is provided. Further, PMD layer 240 is shown transparently in FIG. 5C.

The barrier layer 240 and dielectric layer 240c of this preferred embodiment can assist patterning dielectric layer 240a in subsequent steps shown in FIGS. 4D, 4E, 4F, 5D, 5E, 5F, 6D, 6E, and 6F, and are not intended to limit the scope of the present invention. Those skilled in the art will recognize the possibility for directly patterning dielectric layer 240 to achieve the desired objects of the present invention.

Figure 4D:
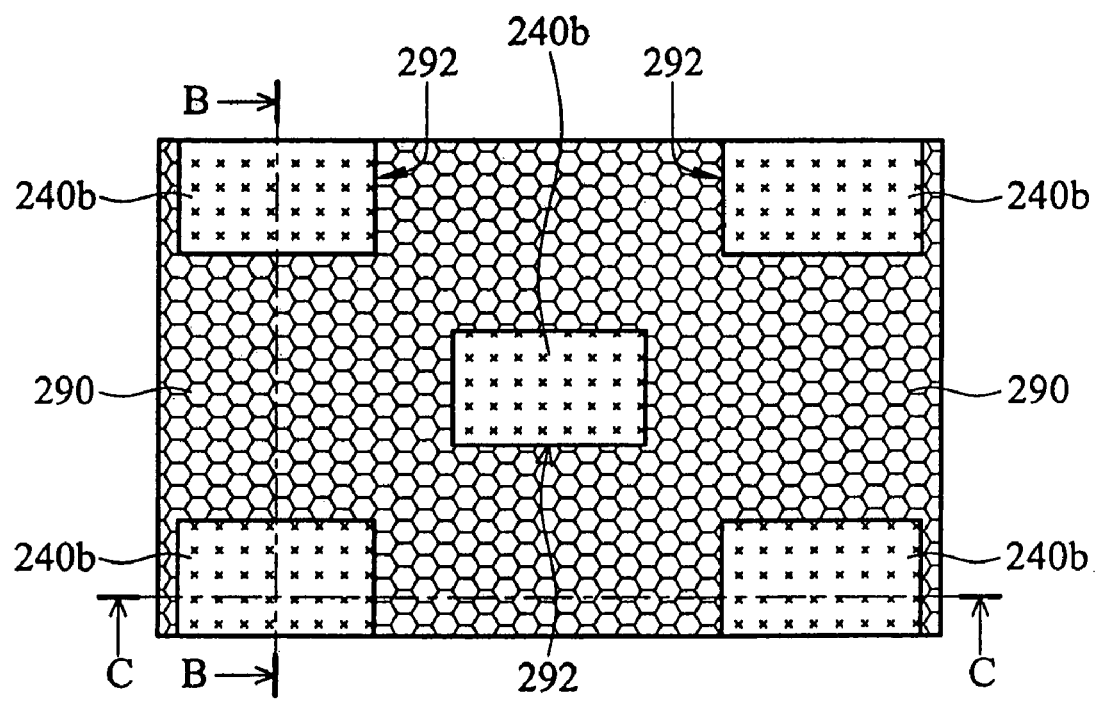
Figure 5D:
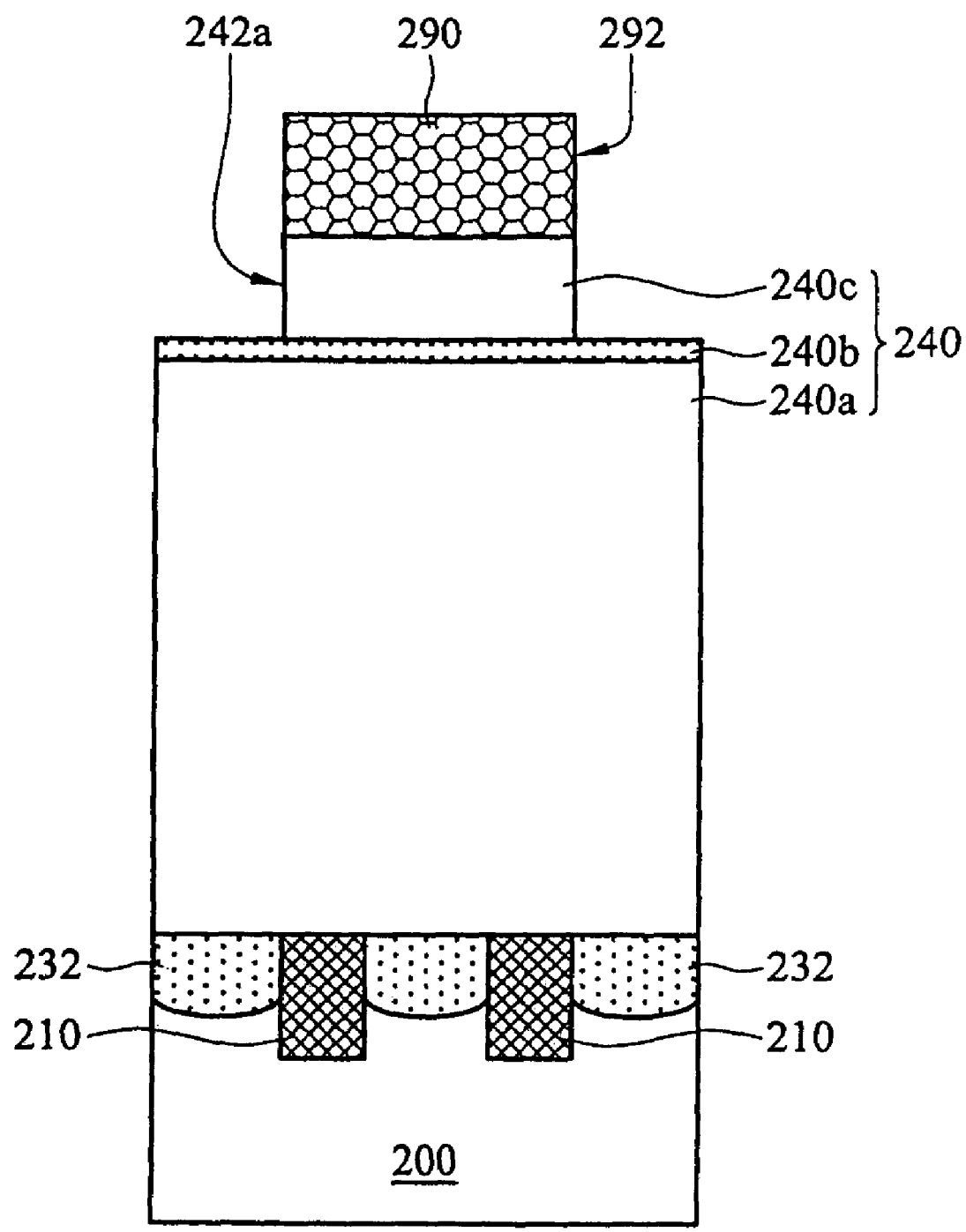
Figure 6D:
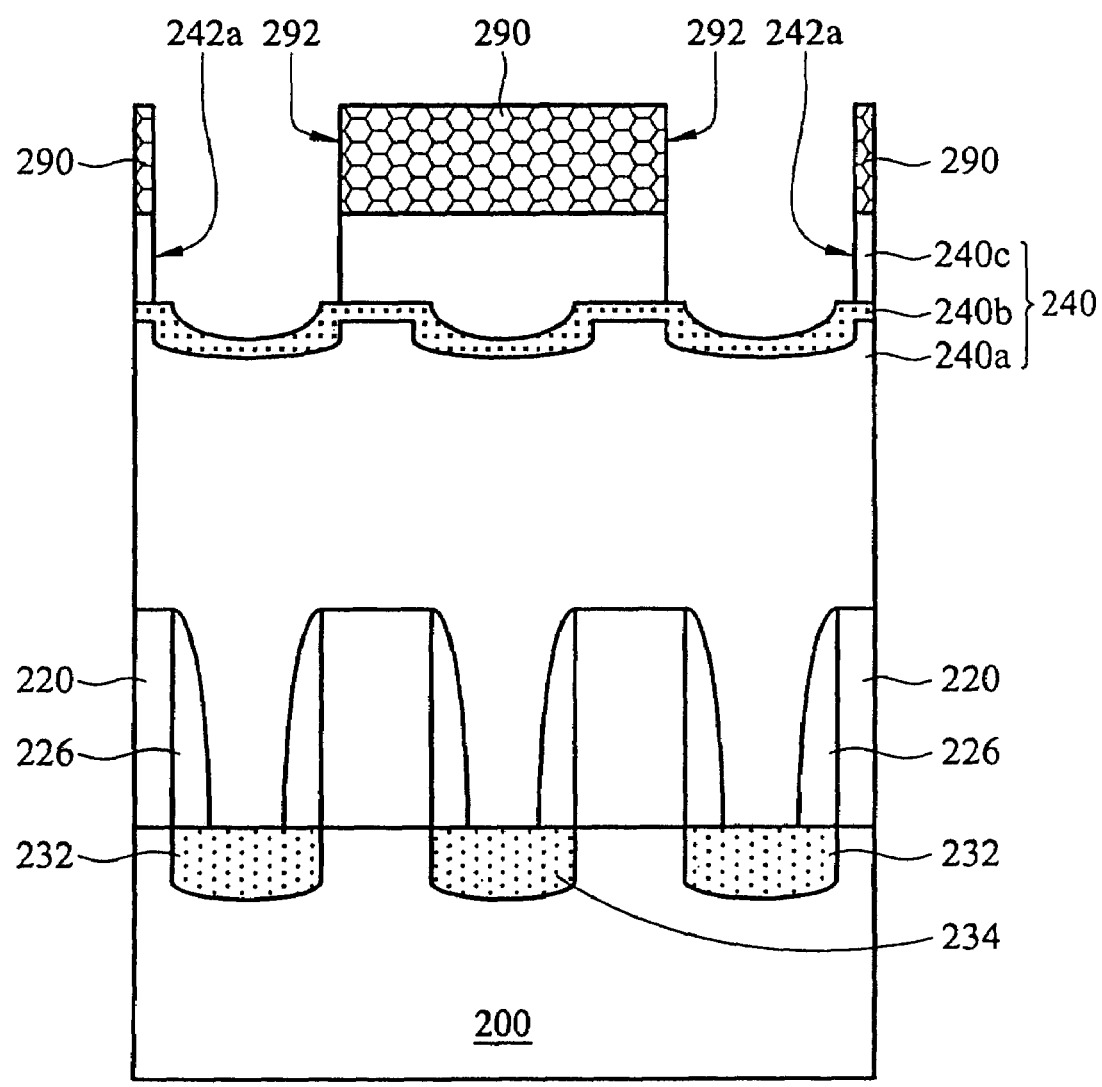

In FIGS. 4D, 5D, and 6D, a patterned resist layer 290, having an opening 292 exposing the PMD layer 240 above drain region 232, is formed on PMD layer 240. The dielectric layer 240c is then patterned by anisotropic etching using patterned resist layer 290 as an etching mask, forming an opening 242a exposing the barrier layer 240b above drain region 232. The dielectric layer 240c is preferably etched with high etch selectivity with respect to barrier layer 240b, using barrier layer 240b as a stop layer in order to pattern dielectric layer 240c first.

Figure 4E:
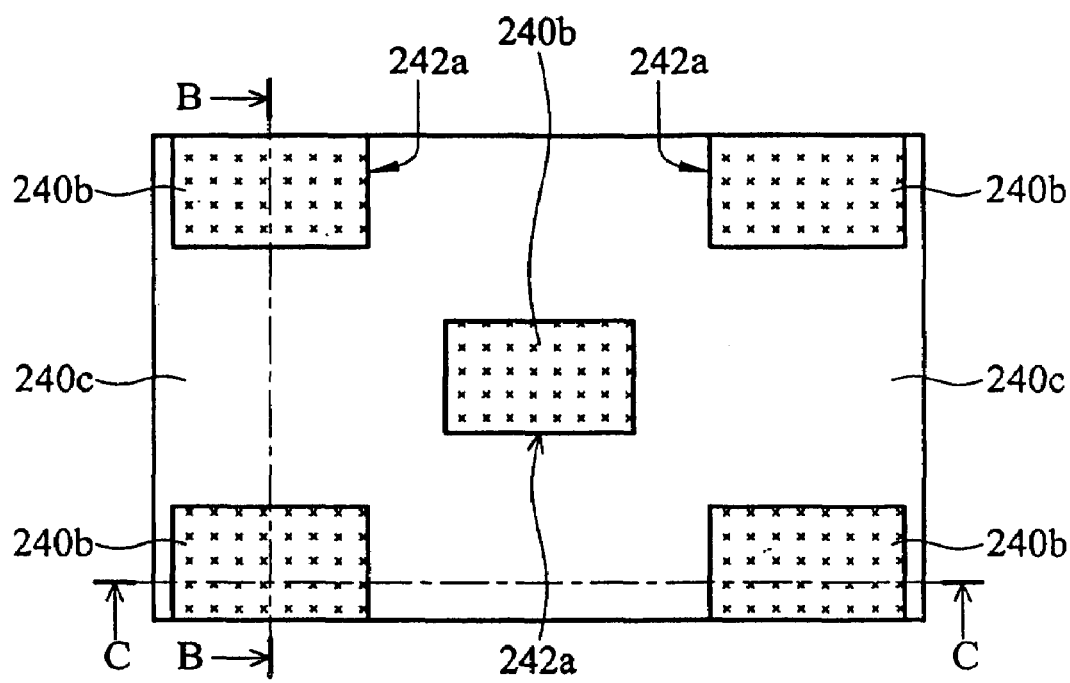
Figure 5E:
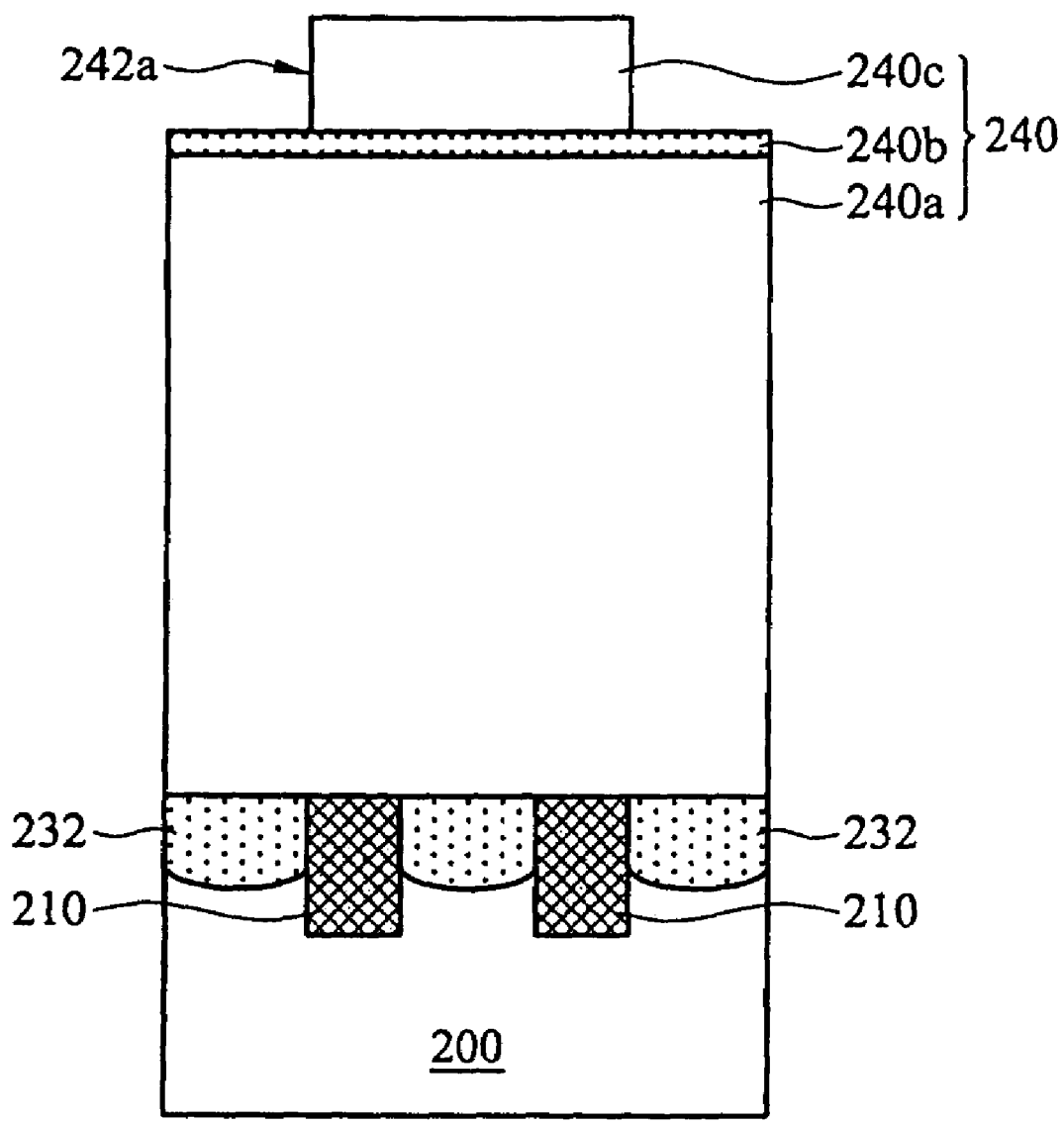
Figure 6E:
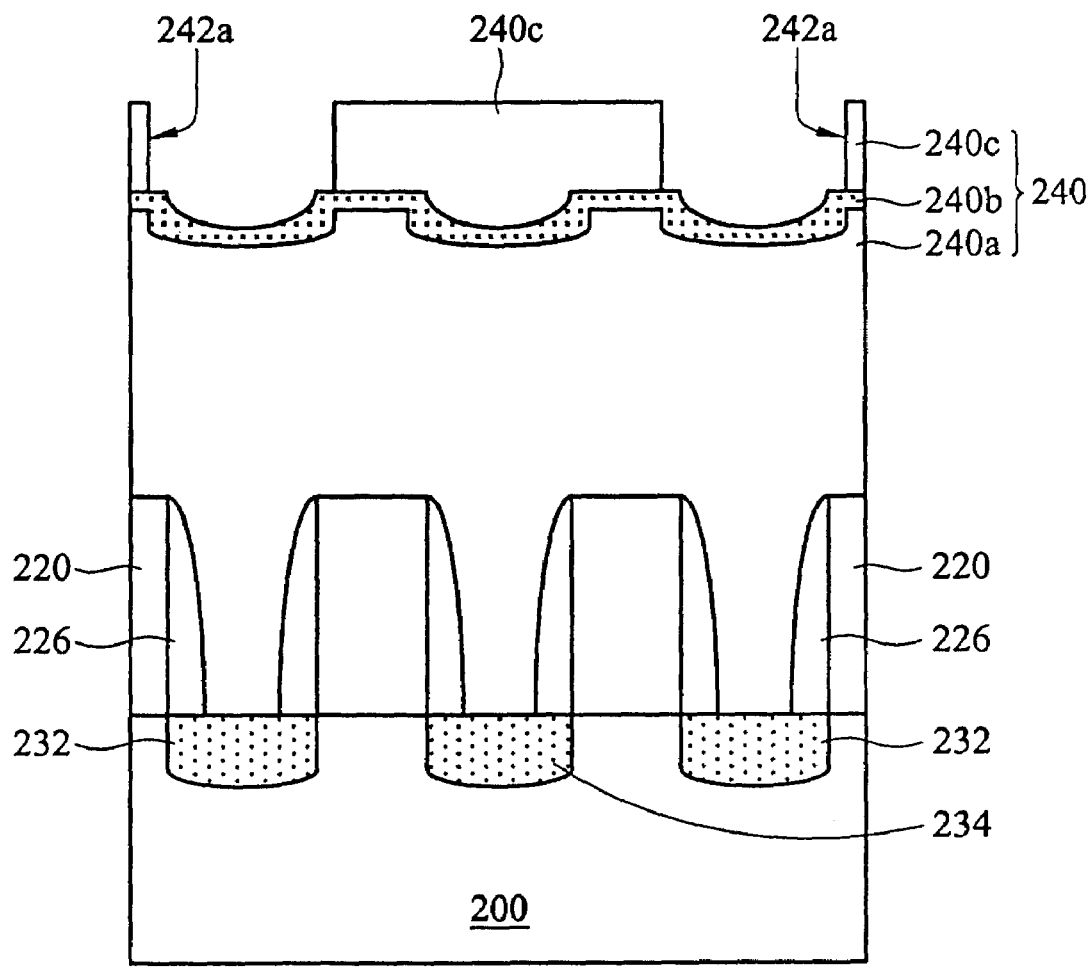

In FIGS. 4E, 5E, and 6E, patterned resist layer 290 is removed by a solvent, ashing using oxygen plasma or ozone, or other methods. However, when barrier layer 240b is not provided to isolate dielectric layer 240a during the ashing procedure, dielectric layer 240a may be poisoned by ozone, oxygen molecules, oxygen atoms, and oxygen radicals, all forming voids. The barrier layer 240b can isolate dielectric layer 240a from ozone, oxygen molecules, oxygen atoms, oxygen radicals, and other corrosive substances during the ashing procedure. Thus, formation of barrier layer 240b can increase the choice of methods to remove patterned resist layer 290.

Figure 4F:
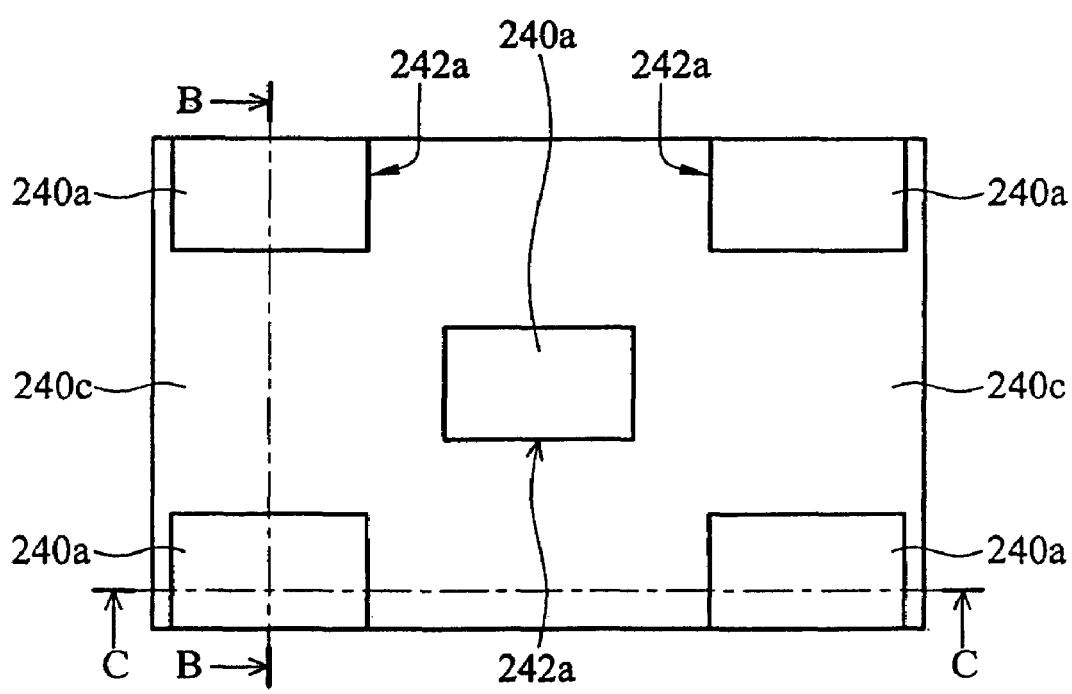
Figure 5F:
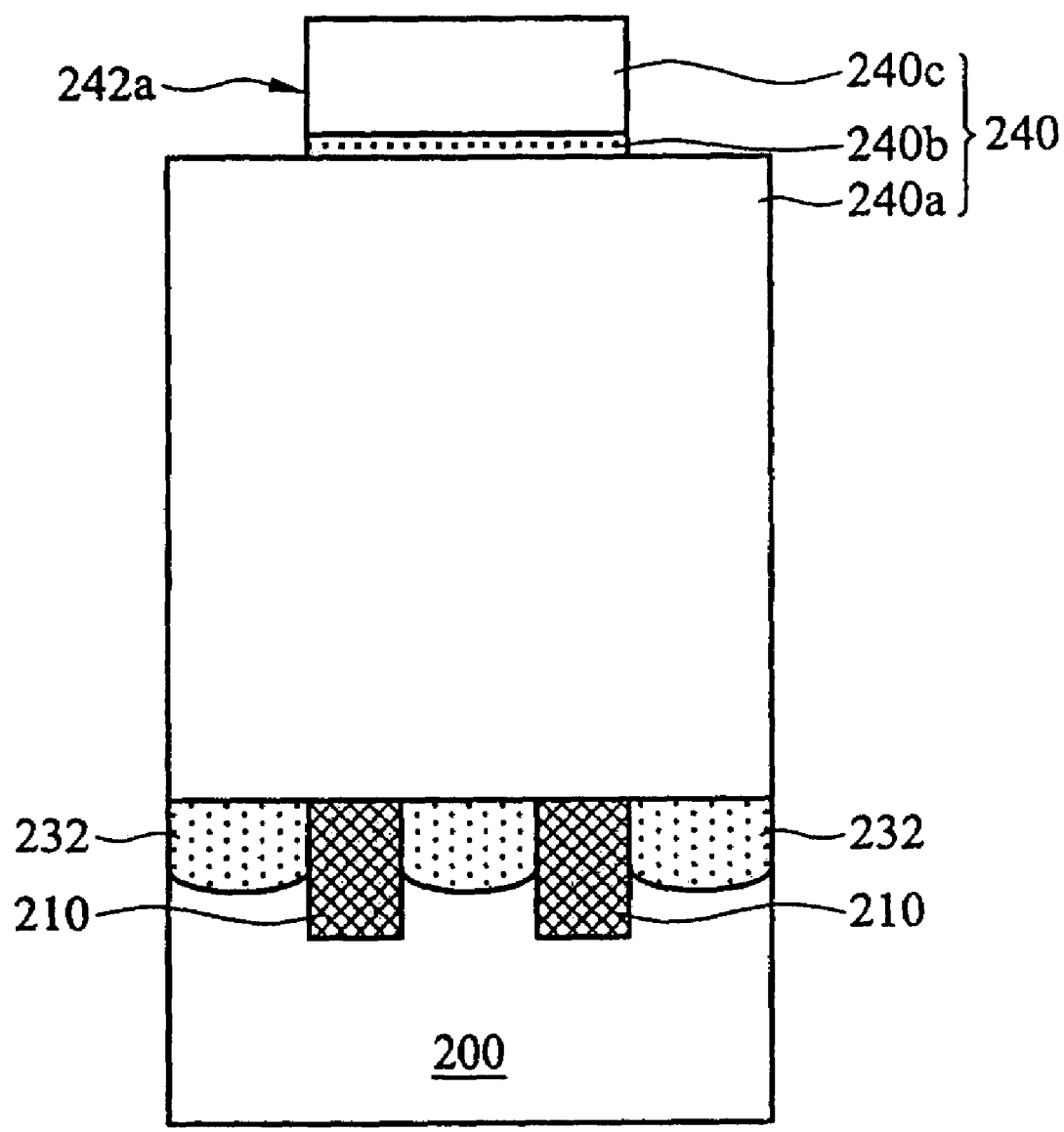
Figure 6F:
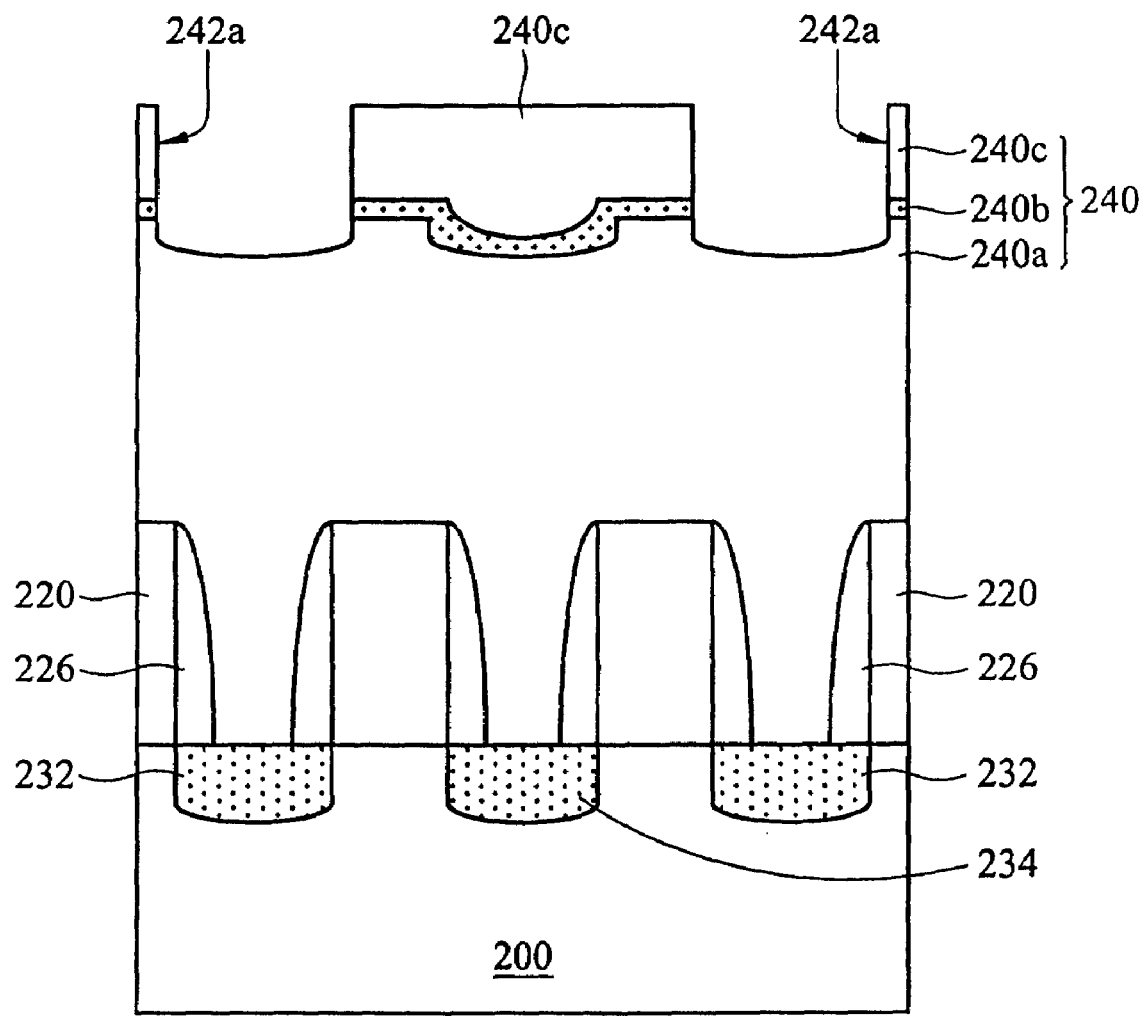

In FIGS. 4F, 5F, and 6F, the barrier layer 240b at the bottom of opening 242a is removed. For example, the barrier layer 240b can be removed by anisotropic etching using dielectric layer 242c as an etching mask. The barrier layer 240b is preferably etched with high etch selectivity with respect to dielectric layer 240a, using dielectric layer 240a as a stop layer, etching barrier layer 240b prior to dielectric layer 240a.

Figure 4G:
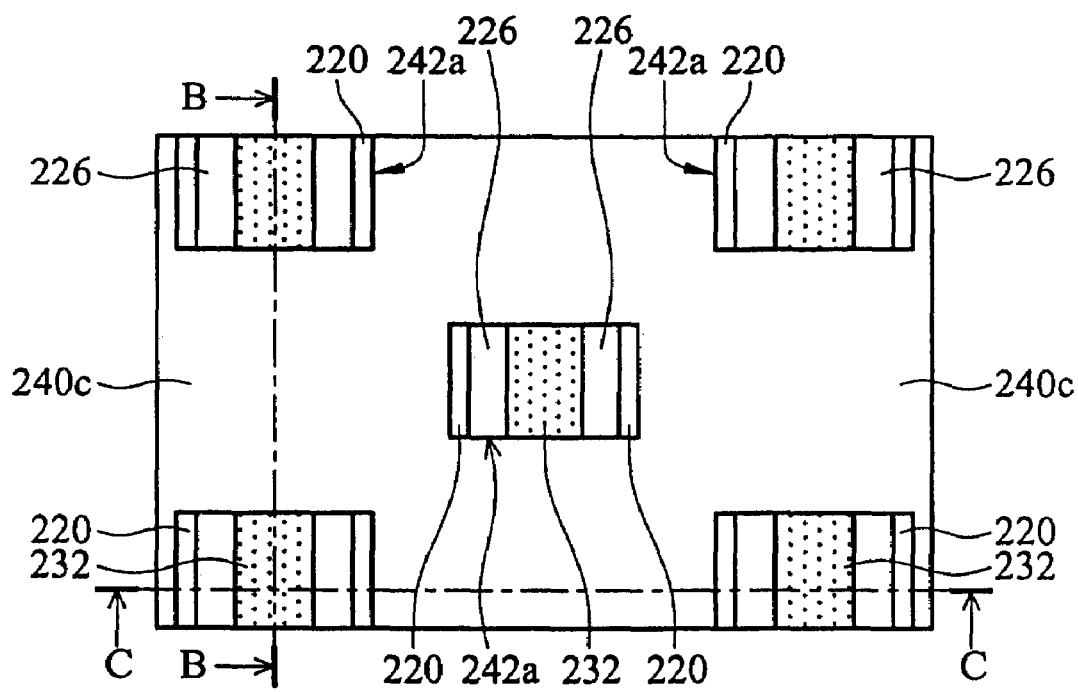
Figure 5G:
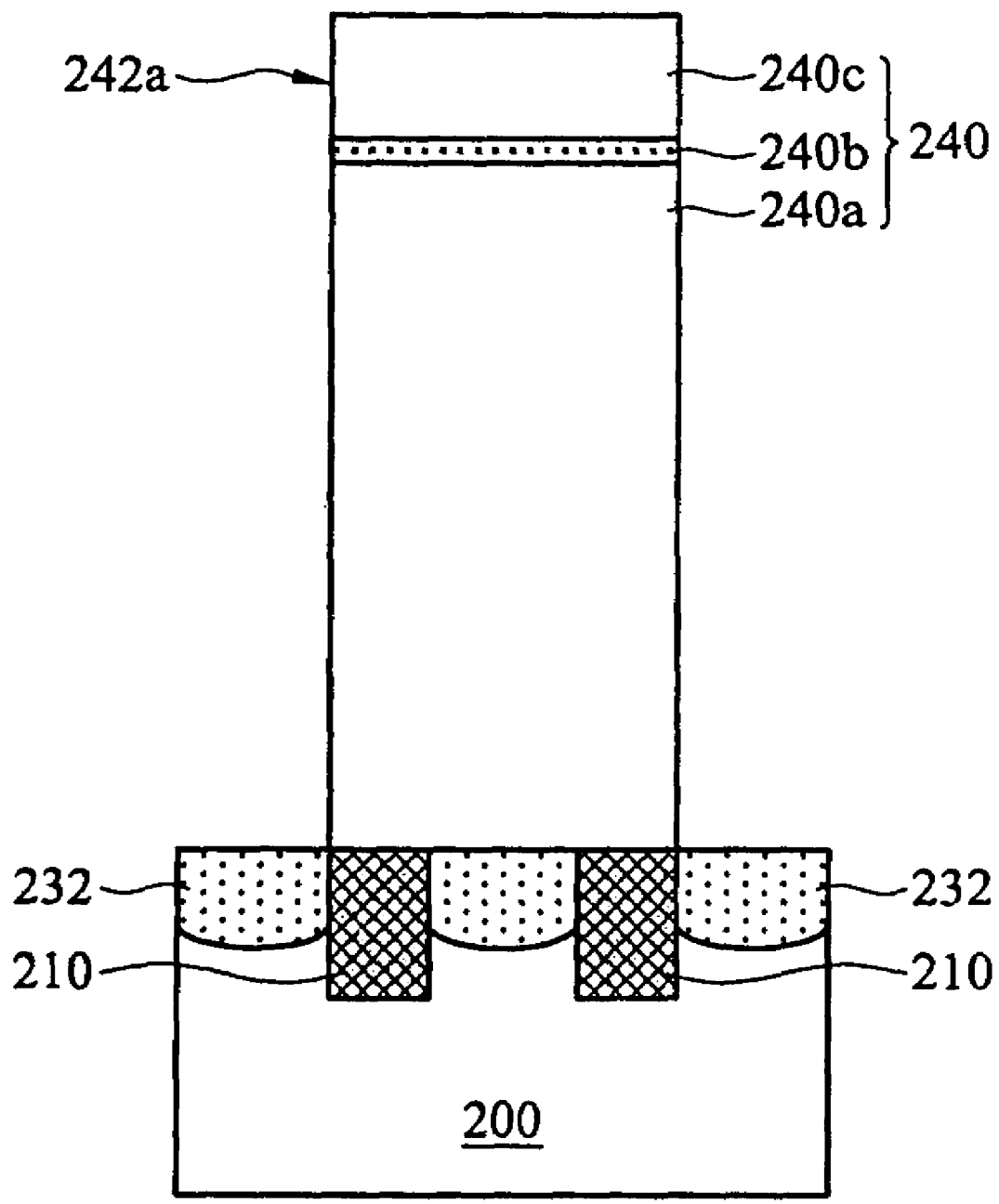
Figure 6G:
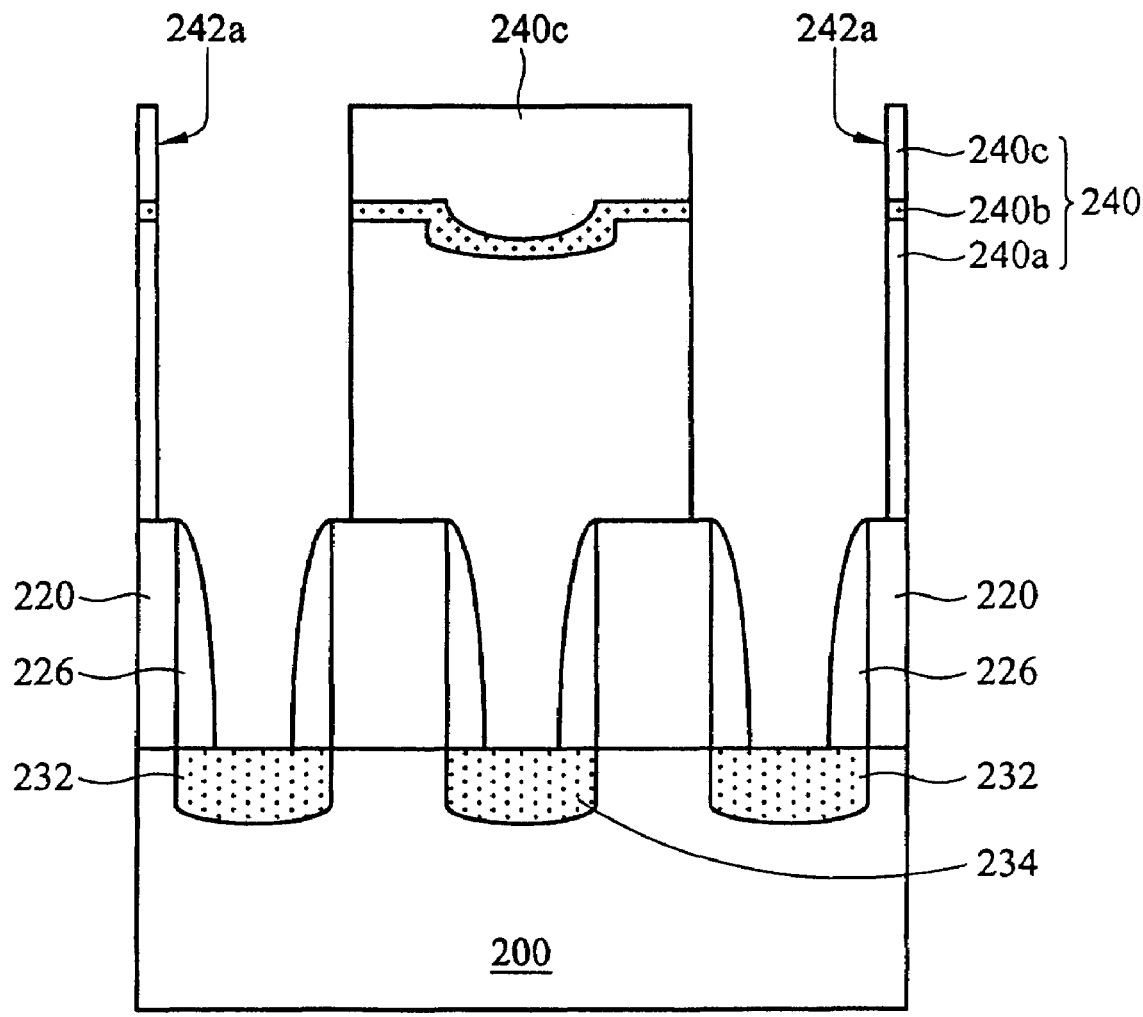

In FIGS. 4G, 5G, and 6G, dielectric layer 240a is isotropically etched using barrier layers 240b and 240c as an etching mask, forming a via 242 exposing drain region 232.

In FIG. 5G, dielectric layer 240a of the present invention is spin-coating material such as polyimide, polysilsequioxane, fluorinated polyimide, or other materials having excellent hole-filling capability. Thus, when the design rule is reduced to about 0.070 μm to 0.090 μm, dielectric layer 240a prevents voids possibly incurring bit line-bit line shorts during formation, and also connecting two neighboring vias 242 during formation of via 242.

In FIG. 6G, dielectric layer 240a of the present invention is spin-coating material such as polyimide, polysilsequioxane, fluorinated polyimide, or other materials having higher etch selectivity, reaching 30 or greater, with respect to spacer 226. Thus, when the design rule is reduced to about 0.070 μm to 0.090 μm, dielectric layer 240a above drain region 232 can be completely removed by over-etching, maintaining integrity of spacer 226, preventing exposure of the conductive layer of gate electrode 220 during formation of via 242.

Figure 4H:
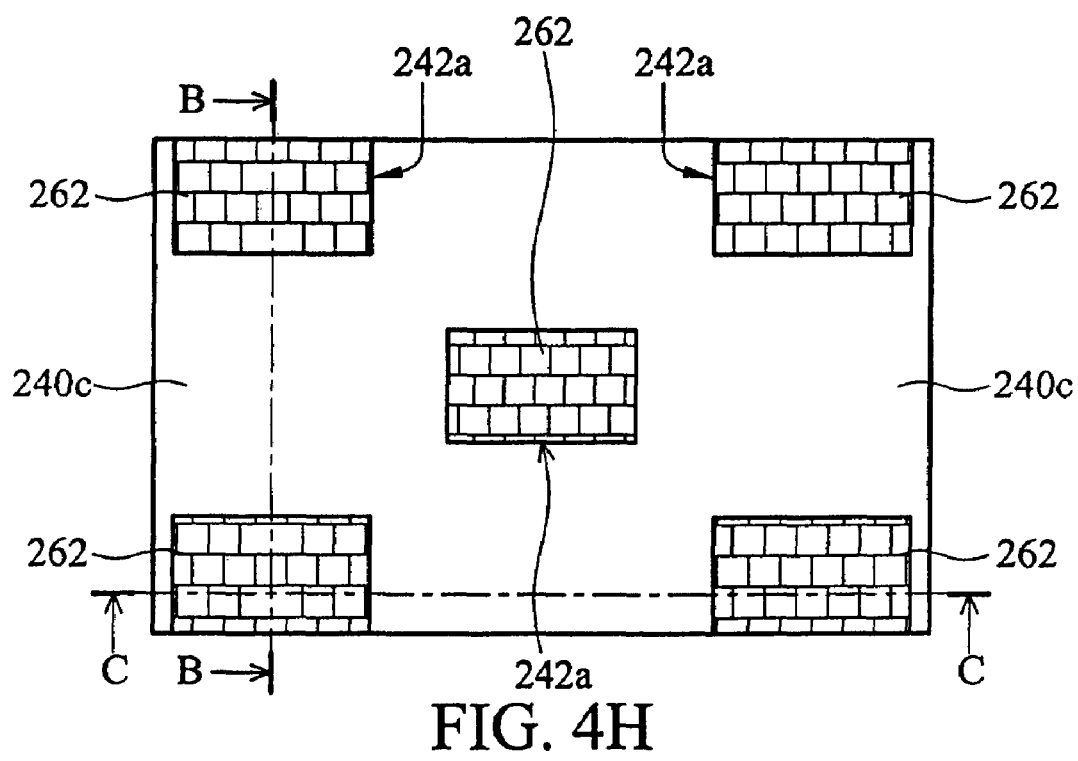
Figure 5H:
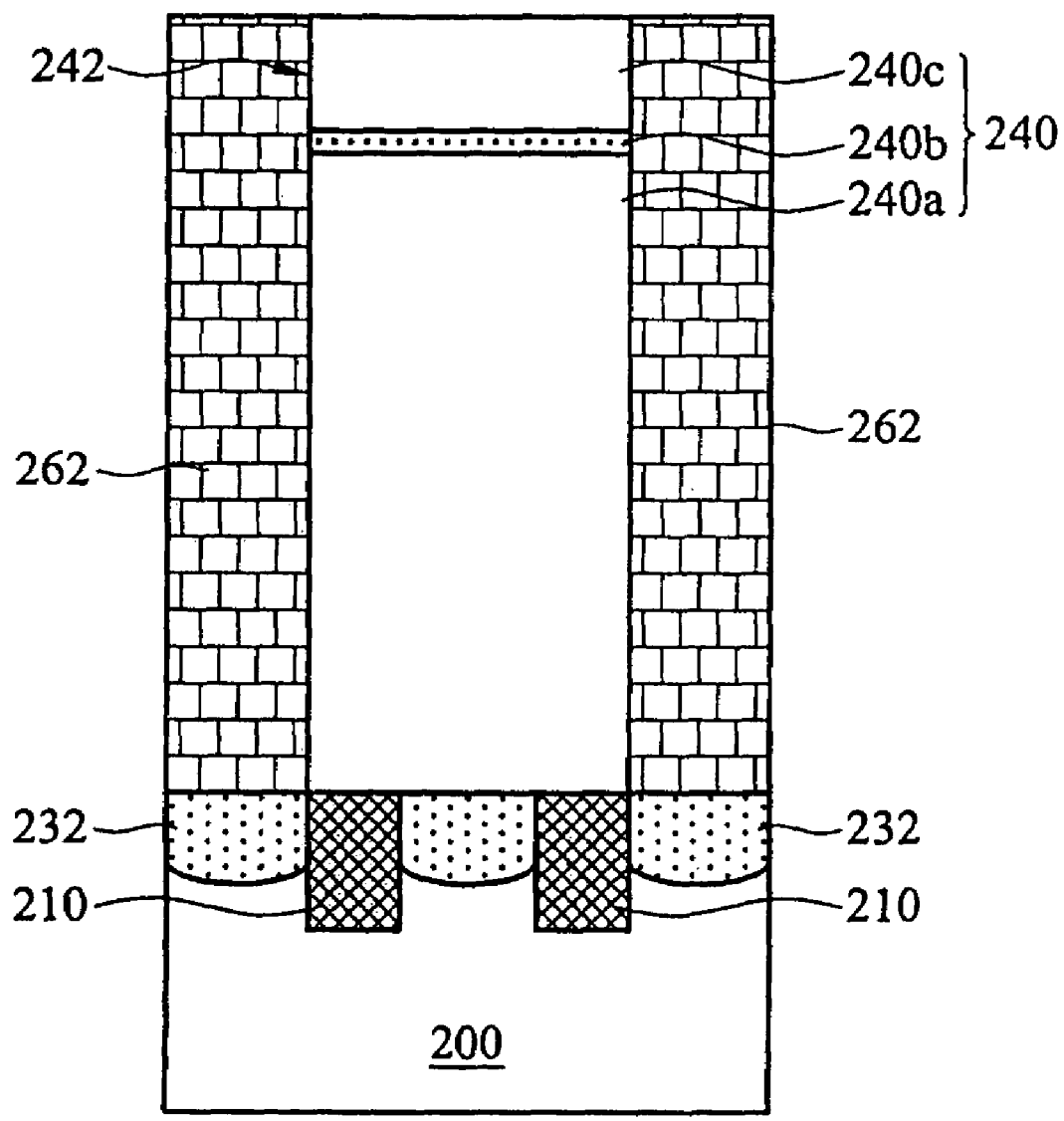
Figure 6H:
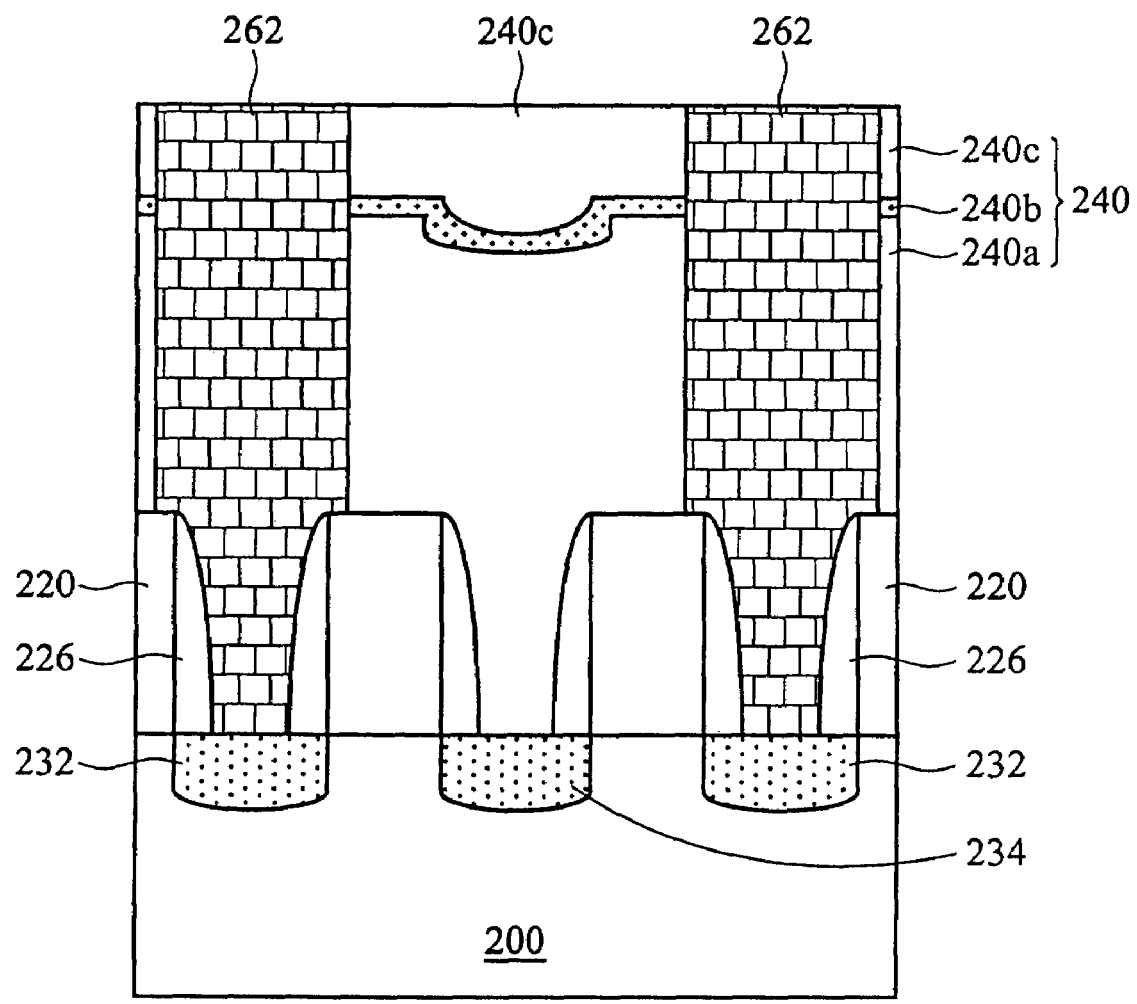

In FIGS. 4H, 5H, and 6H, via 242 is filled with a conductive layer such as doped polycrystalline silicon, tungsten, aluminum, copper, or other conductive material, forming a bit line contact pad 262 electrically connecting to drain region 232. The conductive layer can be formed blanketly over substrate 200 by CVD, MOCVD, or PVD such as sputtering, electrical plating, or other methods. The unwanted conductive layer is then removed by CMP, etching, or other methods, leaving the conductive layer in via 242 as bit line contact pad 262.

In FIG. 5H, the neighboring vias 242 are isolated by PMD layer 240 and isolation 210. No void connecting the neighboring vias 242 occurs. Thus, the neighboring bit line contact pad 262 are also isolated, preventing bit line-bit line short when a bit line (not shown) is subsequently formed.

In FIG. 6H, as described, dielectric. layer 240a over drain region 232 can be completely removed by over-etching, and integrity of spacer 226 is maintained, preventing exposure of the conductive layer of gate electrode 220 during formation of via 242. Therefore, bit line contact pad 262 can electrically connect to drain region 232, but not to the conductive layer of gate electrode 220, thereby preventing both CB open and word line-bit line short when a bit line (not shown) is subsequently formed.

Thus, the results show efficacy of the inventive structure and method in using a spin-coating material such as polyimide, polysilsequioxane, fluorinated polyimide, or other materials as PMD layer, avoiding bit line-bit line short, CB opening and word line-bit line short, as in the known art, thereby improving process yield and decreasing costs, achieving the objects of the present invention.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of fabricating a bit line contact structure, comprising:
   providing a substrate having a transistor thereon, the transistor having a gate electrode, drain region, and source region;
   blanketly forming a first dielectric layer on the transistor using spin coating;
   conformally forming a barrier layer covering the first dielectric layer;
   blanketly forming a second dielectric layer on the barrier layer;
   forming a patterned resist layer on the second dielectric layer;
   etching the second dielectric layer using the patterned resist layer as an etching mask, forming an opening exposing the barrier layer;
   removing the patterned resist layer;
   removing the barrier layer in the opening;
   etching the first dielectric layer using the second dielectric layer as an etching mask, forming a via, wherein a width of a portion of the via above the barrier is substantially the same as a width of another portion of the via lower than the barrier; and
   filling the via with a conductive layer.

2. The method as claimed in claim 1, further comprising removing the patterned resist layer using ashing.

3. The method as claimed in claim 1, wherein the first dielectric layer comprises polyimide, polysilsequioxane, or fluorinated polyimide.

4. The method as claimed in claim 1, wherein the first dielectric layer is about 3000 Å to 4000 Å thick.

5. The method as claimed in claim 1, wherein the conductive layer is doped polycrystalline silicon.

6. The method as claimed in claim 1, wherein the conductive layer is tungsten, aluminum, or copper.

7. The method as claimed in claim 1, wherein the conductive layer is about 2000 Å to 4000 Å thick.

8. The method as claimed in claim 1, wherein the barrier layer is SiN.

9. The method as claimed in claim 1, wherein the barrier layer is about 100 Å to 300 Å thick.

10. The method as claimed in claim 1, wherein the second dielectric layer comprises an oxide layer formed by a precursor having at least tetra ethoxysilane (TEOS).

11. The method as claimed in claim 1, wherein the second dielectric layer is initially about 3000 Å to 6000 Å thick.

12. The method as claimed in claim 1, wherein planarizing the second dielectric layer uses chemical mechanical polishing (CMP), leaving the second dielectric layer about 1000 Å to 3000 Å thick.

13. The method as claimed in claim 1, wherein etch selectivity of the first dielectric layer with respect to the gate electrode is reaching approximately 30 or greater.

14. The method as claimed in claim 1, wherein the gate electrode further comprises a spacer overlying a sidewall thereof.

15. The method as claimed in claim 14, wherein the spacer is SiN.

16. The method as claimed in claim 1, wherein the first dielectric layer comprises polymide, and the polymide comprises polysilsequioxane and fluorinated polyimide.

17. The method as claimed in claim 1, wherein a width of a portion of the conductive layer above the barrier is substantially the same as a width of another portion of the conductive layer lower than the barrier.

18. A method for forming a bit line contact structure, comprising:
   providing a substrate having a plurality of gates thereon, wherein the gates have openings therebetween;
   blanketly forming a first dielectric layer on the transistor and filling the openings using spin coating, wherein the first dielectric layer is polysilsequioxane,;
   conformally forming a barrier layer covering the first dielectric layer;
   blanketly forming a second dielectric layer on the barrier layer, forming a patterned resist layer on the second dielectric layer;

etching the second dielectric layer, the barrier layer and the first dielectric layer using the patterned resist layer as an etching mask to form a via, wherein the via shrinks in the opening according to etching selectivity between the gates and the first dielectric layer; and filling the via with a conductive layer.

* * * * *